US010302715B2

(12) United States Patent
Gall et al.

(10) Patent No.: US 10,302,715 B2
(45) Date of Patent: May 28, 2019

(54) MAGNETIC RESONANCE COIL APPARATUS WITH AN ADJUSTABLE CARRIER STRUCTURE

(71) Applicants: Peter Gall, Buckenhof (DE); Andreas Greiser, Erlangen (DE); Martin Harder, Nürnberg (DE); Stephan Zink, Erlangen (DE)

(72) Inventors: Peter Gall, Buckenhof (DE); Andreas Greiser, Erlangen (DE); Martin Harder, Nürnberg (DE); Stephan Zink, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 233 days.

(21) Appl. No.: 15/178,325

(22) Filed: Jun. 9, 2016

(65) Prior Publication Data
US 2016/0363642 A1    Dec. 15, 2016

(30) Foreign Application Priority Data
Jun. 9, 2015   (DE) ........................ 10 2015 210 529

(51) Int. Cl.
*G01R 33/34* (2006.01)
(52) U.S. Cl.
CPC .. *G01R 33/34084* (2013.01); *G01R 33/34007* (2013.01); *G01R 33/34046* (2013.01)
(58) Field of Classification Search
CPC .......... G01R 33/3415; G01R 33/34046; G01R 33/341; G01R 33/5611; G01R 33/36; G01R 33/3614; G01R 33/365; G01R 33/385; G01R 33/34084; G01R 33/3607; G01R 33/3657; G01R 33/4215; G01R 33/34023; G01R 33/60; G01R 33/5616; G01R 33/56554; A61N 2005/1055; G01N 24/081; G01V 3/32; G06T 2207/10088
See application file for complete search history.

(56) References Cited

U.S. PATENT DOCUMENTS

| 7,446,531 B2 * | 11/2008 | Schnell | A61B 5/0555 324/318 |
| 8,928,321 B2 * | 1/2015 | Ladebeck | G01R 33/34046 324/318 |
| 9,024,637 B2 * | 5/2015 | Peter | G01R 33/34007 324/322 |

(Continued)

FOREIGN PATENT DOCUMENTS

| DE | 102005039380 B4 | 6/2009 |
| DE | 102009043446 A1 | 4/2011 |

OTHER PUBLICATIONS

De Zanche, Nicola et. al.: "Modular design of receiver coil arrays", in: NMR Biomed., vol. 21, pp. 644-654; 2008.
(Continued)

*Primary Examiner* — Vinh P Nguyen
(74) *Attorney, Agent, or Firm* — Lempia Summerfield Katz LLC

(57) ABSTRACT

A flexible magnetic resonance coil apparatus, an applicator, and a method for arranging a magnetic resonance coil apparatus on an object under examination are provided. The magnetic resonance coil apparatus includes at least one coil element and at least one carrier structure. The at least one carrier structure is configured to adapt its geometric shape.

9 Claims, 11 Drawing Sheets

(56) References Cited

U.S. PATENT DOCUMENTS

2007/0040555 A1 2/2007 Wohlfarth
2011/0074420 A1 3/2011 Ladebeck

OTHER PUBLICATIONS

Graessl, Andreas et. al.: "Modular 32-Channel Transceiver Coil Array for Cardiac MRI at 7.0T", in: Magnetic Resonance in Medicine, vol. 72, pp. 276-290, 2014.
German Office Action for German Application No. 102015210529.6 dated Feb. 5, 2018.

* cited by examiner

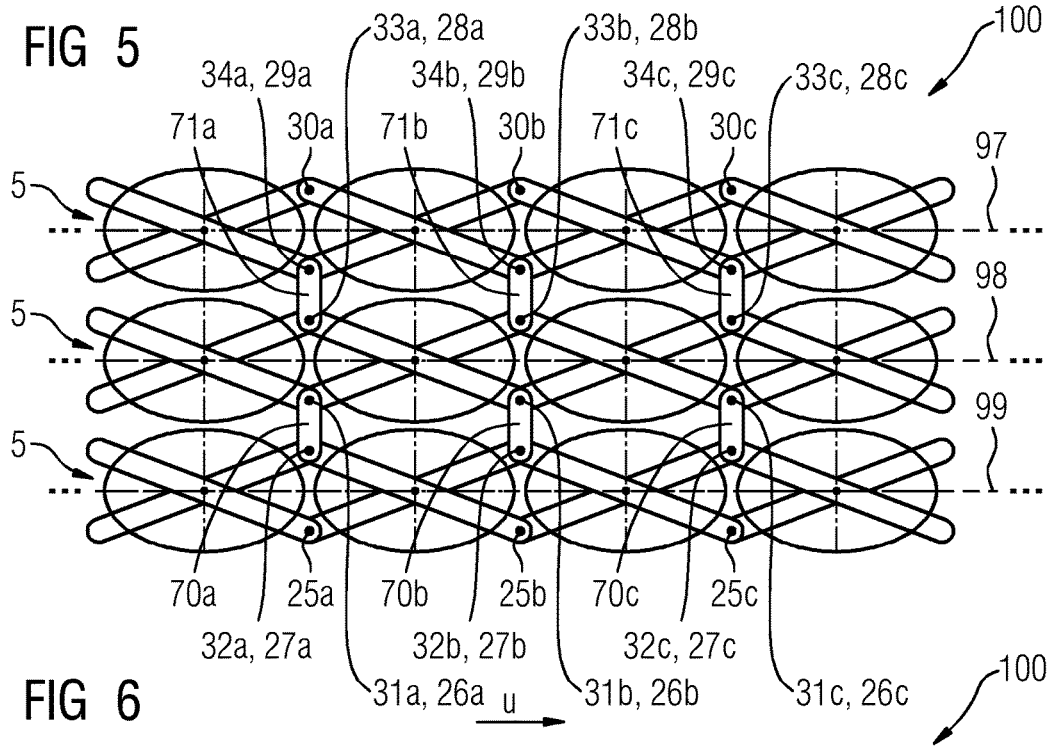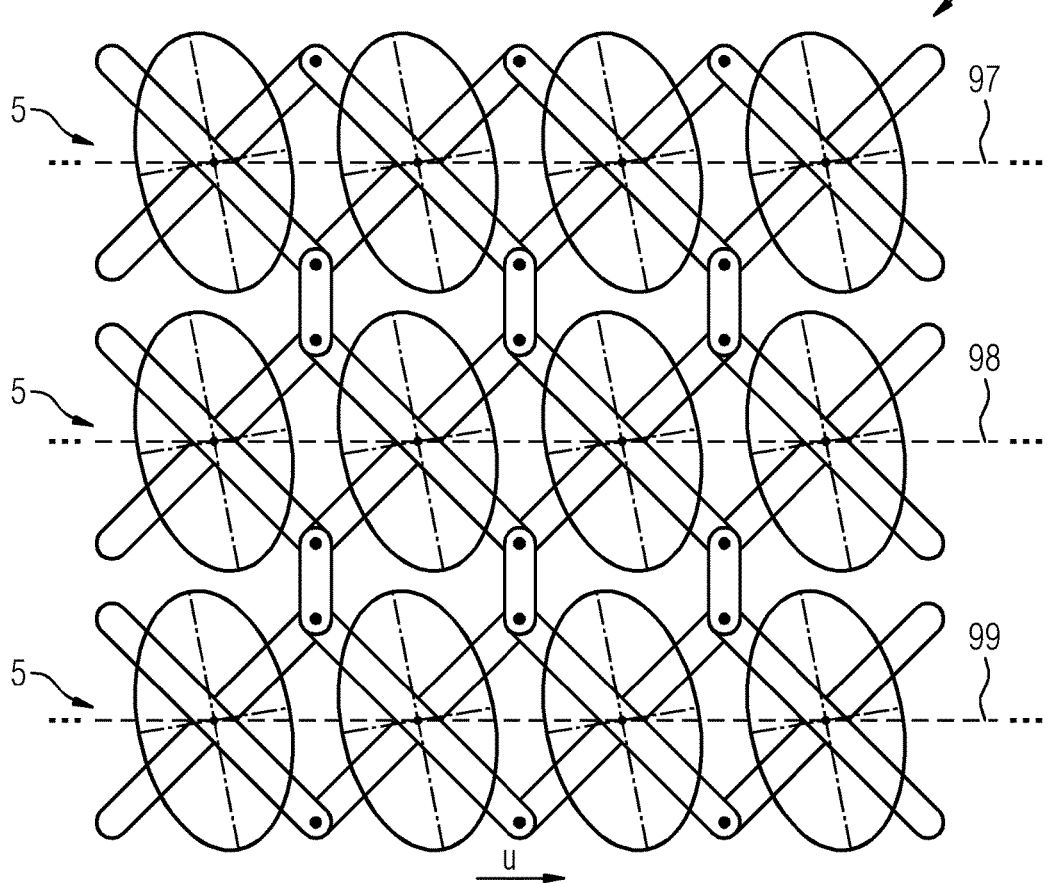

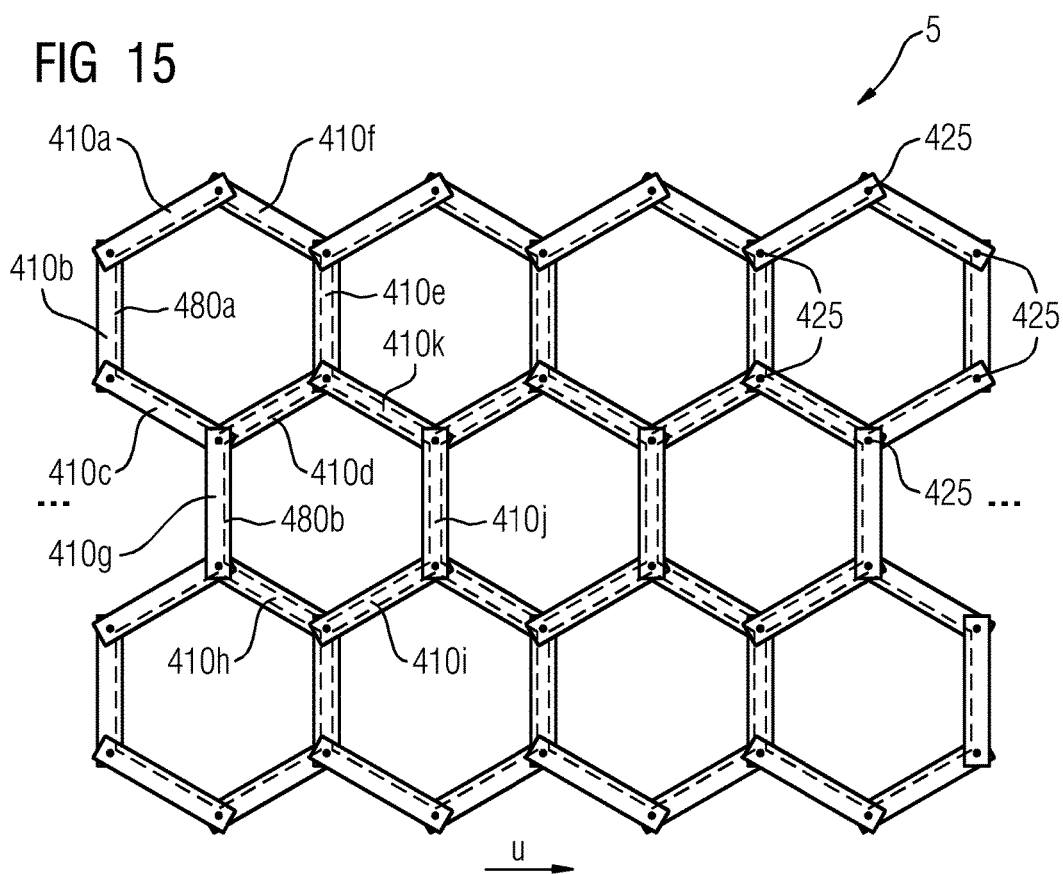
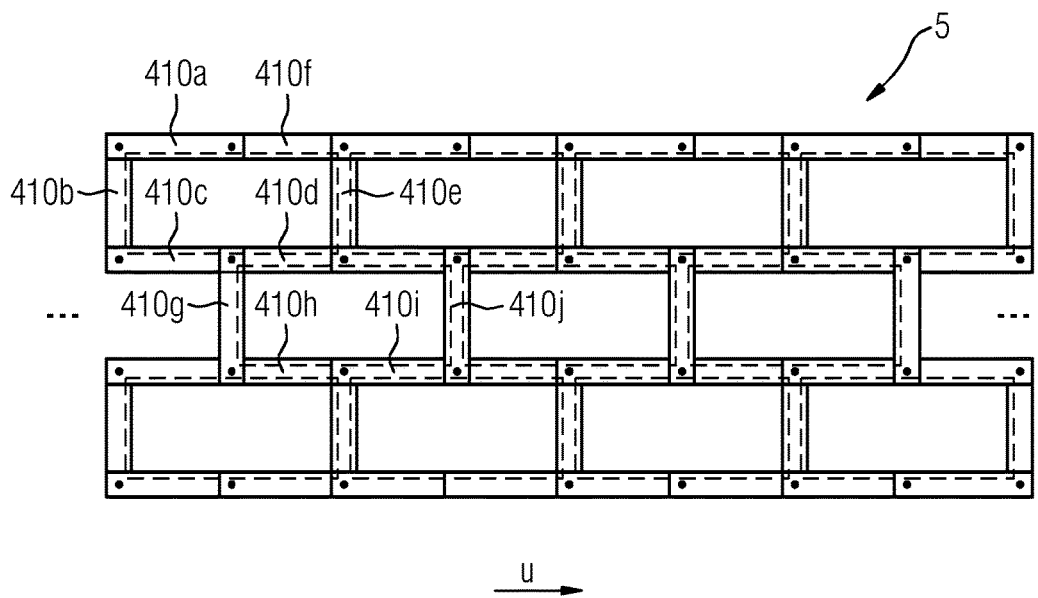

u → u →

MAGNETIC RESONANCE COIL APPARATUS WITH AN ADJUSTABLE CARRIER STRUCTURE

This application claims the benefit of DE 10 2015 210 529.6, filed on Jun. 9, 2015, which is hereby incorporated by reference in its entirety.

BACKGROUND

The present embodiments relate to a flexible magnetic resonance coil apparatus, an applicator, and a method for arranging a magnetic resonance coil apparatus on an object under examination.

Imaging methods are important aids in medical technology. For example, in clinical sectional imaging, magnetic resonance imaging (MRI) is characterized by high and variable soft-tissue contrast. To create an image using magnetic resonance imaging, typically one or more magnetic resonance coil devices are used to send and/or receive radio-frequency electromagnetic signals.

Special magnetic resonance coil devices (e.g., local coils) ideally adapted to the optimum degree to the size of the body parts under examination are often used for MRI imaging of peripheral body regions such as arm and leg joints, since a good filling factor and a minimized spatial distance between the region to be measured and the coil elements usually included by the magnetic resonance coil devices improve the signal-noise ratio and hence the image quality. If the design of the magnetic resonance coil device is too large, the image noise increases. If the magnetic resonance coil is designed too small, this may impair the patient's comfort as the magnetic resonance coil may exert an unpleasant pressure or even may not be used at all.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a magnetic resonance coil apparatus that enables improved image quality with magnetic resonance imaging together with a high degree of patient comfort is provided.

The magnetic resonance coil apparatus according to one or more of the present embodiments includes at least one coil element and at least one carrier structure. The at least one carrier structure is embodied to adapt a geometric shape (e.g., a contour may be set in accordance with an object under examination, such as a human or animal patient). The magnetic resonance coil apparatus may fit to a surface of the object under examination such that the filling factor is maximized (e.g., not only the carrier structure may be adapted flexibly, but also the entire magnetic resonance coil apparatus including at least one coil element of the magnetic resonance coil apparatus). This enables the signal-noise ratio of the MRI to be optimized.

The magnetic resonance coil apparatus may include one or more coil elements. In the case of a plurality of coil elements, a phased-array coil arrangement (PA) may be provided. The coil elements are configured to transmit and/or receive radio-frequency electromagnetic signals (e.g., to receive magnetic resonance signals).

One embodiment provides that each of the at least one carrier structure includes a plurality of carrier elements, forming a closed chain. The carrier elements may be connected to one another (e.g., in the case of carrier structure with N carrier elements, the first carrier elements may be connected to the second carrier element, the second carrier element may be connected to the third carrier element, etc., and the N-th carrier element may be connected to the first carrier element). The connections may, for example, be embodied movably relative to one another. The possibility of the relative movement of the carrier elements enables the shape of the carrier structure to change (e.g., may adopt different operating states). Depending upon the operating state, the closed chain may have different chain lengths (e.g., different states of expansion and/or geometric shapes). The chain may include flush (e.g., directly adjacent, three-dimensional geometric objects such as a cylinder (a circular cylinder) that may also have variable diameters, and/or a cone that may also have a variable conicity). This enables the magnetic resonance coil apparatus to be adapted flexibly to any body parts to be examined, such as, for example, legs and/or arms (e.g., leg and/or arm joints).

One embodiment provides that each of the carrier elements includes at least two carrier bars with an adjustable relative orientation (e.g., the at least two carrier bars are arranged adjustably at an angle with respect to one another). Therefore, the at least two carrier bars may be arranged rotatably with respect to each other (e.g., at least one of the two carrier bars is arranged rotatably). A carrier bar may be an oblong object (e.g., the carrier bar may have a main extension that may be described as the length, parallel to a main direction of extension, which is significantly longer (more than twice as long, more than four times as long, or more than ten times as long as a maximum lateral extension) where the lateral extension is oriented perpendicular to the main extension). Therefore, the carrier bars may be very thin compared to a length.

The orientation of a carrier bar may be defined by a main direction of extension so that the relative adjustability of the orientation of the at least two carrier bars includes the adjustability of the main directions of extension of the at least two carrier bars.

In one embodiment, the adjustability of the relative orientation of the at least two carrier bars is spatially unrestricted (e.g., not limited to rotatability in specific planes).

For example, the at least two carrier bars may be bent toward each other in a common plane and/or tilted relative to the common plane. This may, for example, be achieved in that the carrier structure includes spherical joints arranged between the at least two carrier bars. The spherical joints facilitate the rotation of the at least two carrier bars in all spatial directions.

The carrier bar may have a straight shape parallel to the main direction of extension, or the carrier bar may also have a shape that is not straight. For example, the carrier bar may have a curvature. Hence, the carrier structure may be well adapted geometrically to any possible objects. The rotatability of the carrier bars may also achieve an adaptation of the contour of the carrier structure.

The carrier bars may have an elasticity and/or deformability facilitating the adaptation of the geometry of the at least one carrier structure to the geometry of an object under examination.

One embodiment provides that each of the carrier elements includes a first and a second carrier bar arranged in a cross shape. The carrier bars of each carrier element of the same carrier structure arranged in a cross shape may in each case define a crossover point lying on a carrier structure plane of the respective carrier structure. At the same time, each of the carrier elements is arranged on two other carrier elements of the same carrier structure.

The first and the second carrier bar of a carrier element may, for example, be arranged rotatably about the crossover point and/or adjustably at an angle with respect to each other (e.g., the first and the second carrier bar of a carrier element may rotate about a crossover point opposite to one another (in all spatial directions). The first and the second carrier bar may be connected by a common rotation joint (e.g., a spherical joint).

The main extensions (e.g., the lengths) of the carrier bars may be identical (e.g., the carrier bars may be of the same length). The first and the second carrier bar may, for example, be arranged in a cross shape such that the crossover point divides the lengths of the two carrier bars into two equal partial lengths in each case.

Depending upon the operating state of the carrier structure, the crossover points in the carrier structure plane may lie on different flat curves (e.g., an oval, an ellipse or a circle). This enables flexible adaptation of the geometry.

If, for example, a circularly cylindrical object, which consequently has a circularly cylindrical external surface, is examined by the magnetic resonance coil apparatus according to one or more of the present embodiments, the carrier structure may advantageously adopt on a shape such that the crossover points of the carrier bars lie on the circularly cylindrical external surface of the object.

One embodiment provides that the first carrier bar and the second carrier bar of each carrier element each span a carrier element surface. At the same time, the first carrier bar and the second carrier bar in the carrier element surface are arranged rotatably with respect to each other so that the angle enclosed by the carrier bars in the carrier element surface may be varied.

The carrier element surfaces are spanned by the main directions of extension of the first and second carrier bars. The enclosed angle may also be considered to be the angle enclosed by the two main directions of extension of the first and second carrier bars of a carrier element.

The possibility of changing the angle enables the circumference of the closed chain of the carrier structure, and hence a state of expansion, to be changed, thus enabling the magnetic resonance coil apparatus to be adapted to objects under examination with different circumferences. Hence, there is no need to provide a plurality of magnetic resonance coil devices (e.g., inflexible magnetic resonance coil devices) in order to optimize the filling factor.

One embodiment provides that at least one coil element is arranged on at least one of the carrier elements. At the same time, the at least one coil element is embodied along a coil element surface in a planar manner. The extension of the coil perpendicular to the coil element surface may be much shorter (e.g., four times shorter, ten times shorter, or thirty times shorter than a minimum extension along the coil element surface (parallel to the coil element surface)). At the same time, the coil element surface is arranged substantially parallel to the respective carrier element surface. The coil element in the coil element surface may have a maximum extension, and the coil element surface has a minimum and a maximum distance from the respective carrier element surface over the coil element surface. The minimum distance may be equal to the maximum distance. The difference between the maximum and minimum distance is significantly shorter (e.g., twice, four times, or preferably ten times shorter than the maximum extension of the coil element in the coil element surface). In this arrangement, the orientation of the at least one coil element with respect to the object under examination is determined by the contour of the carrier structure so that, due to the geometric adaptation of the carrier structure to the object under examination, the at least one coil element also has a position and/or orientation particularly suitable for the acquisition of magnetic resonance signals from the interior of the object under examination.

One embodiment provides that the at least one carrier structure for arranging two carrier elements in each case includes a first and a second articulated joint. The first articulated joint connects the first carrier bar of a first of the two carrier elements to the second carrier bar of a second of the two carrier elements, and the second articulated joint connects the second carrier bar of the first of the two carrier elements to the first carrier bar of the second of the two carrier elements.

In other words, therefore, the carrier bars of a carrier structure may be arranged comparably to the slats of a latticework fence. The articulated joints may facilitate a relative movement (e.g., a rotation of the carrier bars connected thereto).

For example, one possible component of an overall rotation of the first articulated joint may represent a rotation about a first axis of rotation extending through the first articulated joint parallel to the carrier structure plane of the carrier structure including the carrier elements and is oriented parallel to a normal of a connecting line between the crossover points of the carrier elements connected by the first articulated joint. Similarly, one possible component of an overall rotation of the second articulated joint may represent a rotation about a second axis of rotation extending through the second articulated joint parallel to the carrier structure plane of the carrier structure including the carrier elements and oriented parallel to a normal of a connecting line between the crossover points of the carrier elements connected by the second articulated joint. A rotation of this kind, for example, enables the angle enclosed by the carrier bars in the carrier element surface and/or the chain length of the at least one carrier structure to be changed.

In one embodiment, a further possible component of the overall rotation of the first and of the second articulated joint may represent a rotation about a further axis of rotation extending through the first and second articulated joint. A rotation of this kind, for example, enables the shape of the at least one carrier structure to be flexibly adapted.

Additional components of the overall rotation of the articulated joints may be provided so that the flexibility of the carrier structure may be additionally increased. Hence, an easy-to-produce mechanical mechanism facilitating high flexibility of the carrier structure may be created.

One embodiment provides that at least one coil element is arranged on each of the carrier elements. This enables high measurement coverage (e.g., a large spatial sensitivity range of the magnetic resonance coil apparatus) to be achieved since the coil elements may be positioned around the possible object under examination. Since the carrier elements may be flexibly geometrically adapted, the coil elements may be flexibly adapted.

One embodiment provides that the magnetic resonance coil apparatus includes at least two carrier structures. The at least two carrier structures are arranged offset with respect to each other. The use of a plurality (e.g., more than just one) of carrier structures that are in addition arranged offset enables the measurement coverage to be further increased.

The carrier structure planes of the at least two carrier structures may be arranged substantially parallel. For example, the angle enclosed by the carrier structure planes is less than 40 degrees, less than 20°, or less than 10 degrees.

For each carrier structure, a geometric center located in the carrier structure plane of the respective carrier structure may be determined. The geometric center of a first carrier structure may be projected perpendicularly into a projection point onto a carrier structure plane of a second carrier structure offset thereto (e.g., an orthogonal projection may be effected). This projection point is only at a short distance from the geometric center of the second carrier structure (e.g., the distance is less than 50 percent, less than 30%, or less than 10% of the maximum extension of the second carrier structure).

The at least two carrier structures may also be arranged offset substantially parallel to the normals of the carrier structure planes (e.g., parallel displacement along the normals of the carrier structure planes may enable the at least two carrier structures to be made to coincide as long as corresponding shapes conform).

A displacement of the carrier structures of this kind enables particularly good measurement coverage, for example, of cylindrical and/or oblong and/or straight objects under examination, such as, for example, arms or legs.

One embodiment provides that the magnetic resonance coil apparatus for arranging the at least two carrier structures includes at least one structural joint.

The at least one structural joint may be suitable for connecting two of the at least two carrier structures (e.g., in a movable manner). This enables the achievement of an arrangement of the at least two carrier structures that is offset to the optimum degree.

The at least one structural joint may include, in each case, one of the articulated joints. A structural joint for arranging (e.g., connecting) two carrier structures may, for example, be integrated in an articulated joint for arranging (e.g., connecting) two carrier elements (e.g., the articulated joint improved in this way may therefore be used for arranging both carrier structures and carrier elements).

A further embodiment provides that the magnetic resonance coil apparatus for arranging the at least two carrier structures includes at least one connecting element. The at least one connecting element may be embodied as bar-shaped. The at least one connecting element may be made of a flexible material, such as, for example, an elastomer.

For example, a first carrier structure may include a first structural joint, and a second carrier structure may include a second structural joint. The first structural joint and the second structural joint are connected to one another by a connecting element. In a similar way, two carrier structures may also be connected to one another by a plurality of connecting elements.

Depending upon the length of the connecting element, at least one connecting element may be used to establish a desired distance between two carrier structures.

A further embodiment provides that the at least one coil element in the coil element surface has a longitudinal extension in a longitudinal direction and a transverse extension in a transverse direction perpendicular to the longitudinal direction. The longitudinal extension is greater than the transverse extension. For example, the transverse direction may be defined as the direction in which the extension of the at least one coil element is minimal. The extension of the at least one coil element may be a maximum in the longitudinal direction. The asymmetry enables an improved geometric adaptation of the at least one coil element to the possible object under examination to be achieved.

The coil element in the coil element surface may be embodied as oval (e.g., elliptic). This is of advantage from the point of view of production technology and/or with respect to the reception characteristics of the coil element.

At least one of the coil elements may have a curvature, for example, about the transverse direction The curvature may enable a better geometric adaptation to a possibly curved object under examination, such as, for example, an arm and/or a leg, to be achieved. Curvature about the transverse direction of a coil element is advantageous since in this case the filling factor may be increased particularly effectively.

A further embodiment provides that the closed chain has a specific chain length according to a state of expansion of the carrier structure. In the state of expansion of the carrier structure in which the chain length is minimal, an angle of rotation of a coil, which is enclosed between the longitudinal direction of the at least one coil element and the carrier structure plane, is greater than an angle enclosed between the transverse direction of the at least one coil element and the carrier structure plane. Hence, the measurement coverage of the coil elements may be optimized.

As already described, the flexibility of the carrier structure enables the carrier structure to adopt different operating states (e.g., states of expansion). Depending on the operating state, the chain is expanded to a greater or lesser degree (e.g., the state of expansion of the carrier structure may differ). For example, a specific carrier structure may advantageously be more greatly expanded during an examination of a circularly cylindrical object under examination with a large diameter than the carrier structure is expanded during an examination of a circularly cylindrical object under examination with a small diameter.

With a greater expansion of the chain, the resultant chain length may be greater than with a lower expansion. Normally, the chain length may not be arbitrarily short (e.g., for structural reasons), but has a minimum chain length in a specific state of expansion. In this state, the angle of rotation of a coil may be equal to 90°, and the coil elements have a lowest extension in the transverse direction (e.g., the coil element surfaces have a lowest extension in the direction of the circumference of the chain).

One basic structural condition limiting the minimum state of expansion may, for example, be a transverse extension of the at least one coil element different from zero. If it is assumed that it is desirable for there to be no overlapping of the coil elements in the circumferential direction, the chain length is at least as long as the sum total of the transverse extensions of the coil elements.

In the case of a state of expansion of the carrier structure with a maximum chain length, the angle of rotation of a coil may be smaller than the angle enclosed between the transverse direction of the at least one coil element and the carrier structure plane. In this case, the angle of rotation of a coil may be equal to 0°.

In one variant, the magnetic resonance coil apparatus includes a contraction mechanism embodied to assist a contraction of the carrier structure to a minimum chain length. For example, at least one part of the articulated joints of the magnetic resonance coil apparatus may have a spring embodied to exert a force on the carrier bars connected by the respective articulated joint. At the same time, the force is directed at reducing the chain length (e.g., the force attempts to contract the carrier structure). A spring joint of this kind may be simple to integrate in the carrier structure. This contraction mechanism may cause the magnetic resonance coil apparatus to lie with a reliably close fit on the object under examination, thus enabling high MRI image quality and a high degree of patient comfort to be achieved.

The contraction mechanism is embodied such that a contraction pressure may be regulated independently of the state of expansion of the at least one carrier structure.

The contraction pressure may be the pressure acting on an object under examination (e.g., a patient), on which the magnetic resonance coil apparatus is to be arranged. In one embodiment, this is selected such that the contraction pressure is perceived as comfortable by the patient.

A further embodiment provides that at least one of the coil elements is arranged permanently in each case on one of the carrier bars. A fastening of this kind is simple and inexpensive to implement. In addition, on a change to the state of expansion of the carrier structure, a coil element permanently arranged by a rigid coupling on one of the two carrier bars of the carrier element may execute a rotation about an axis that is oriented perpendicular to the carrier element surface and passes through the crossover point of the carrier bars. This enables the coil element to adapt an alignment dynamically with the state of expansion of the carrier structure, thus resulting in improved measurement coverage in the circumferential direction of the chain of carrier elements.

However, in this embodiment, the at least one coil element is not rotated by 90° between the minimum and maximum state of expansion as would be desirable for the optimization of the measurement coverage. Therefore, a further embodiment, according to which at least one of the coil elements is arranged rotatably in each case about an axis of rotation of a coil perpendicular to the coil element surface on one of the carrier bars, is provided. At least one of the coil elements may be arranged on a carrier bar of the respective carrier element such that the at least one coil element may be moved relative to the carrier bar.

Compared to the previously described rigid arrangement, in this embodiment, there may be an additional rotation opposite to the previously-described rotation effected by the rigid arrangement. This additional rotation provides that, in the case of the maximum chain length, the coil elements are oriented with a longitudinal extension direction and, in the case of the minimum chain length, oriented with a transverse direction of extension in the circumferential direction of the chain.

A further embodiment provides that the at least one coil element is arranged movably in each case about axis of rotation of a coil perpendicular to the coil element surface on one of the carrier bars arranged so that a relative angle between the longitudinal direction of the respective coil element and a main direction of extension of the respective carrier bar may be varied. At the same time, the magnetic resonance coil apparatus includes a coupling mechanism for changing the relative angle ($\gamma$) as a function of the state of expansion of the carrier structure.

This mechanical coupling enables a uniform change in the respective angle of rotation of a coil to be achieved in the case of a change to the state of expansion of the carrier structure.

In one embodiment, the coupling mechanism for each of the coil elements to be coupled includes a coupling element arranged rotatably about the axis of rotation of a coil. The coupling mechanism includes at least one transmission element arranged on the coupling elements of the coil elements to be coupled and configured to transmit a force onto the coupling element on a change to the state of expansion of the carrier structure.

The coupling element is permanently connected to the coil element to be coupled in order to route the force transmitted by the transmission element to the coil element to be coupled.

In one possible variant, the coupling element is a gear wheel and the transmission element is a gear rack that engages in the gear wheel of the coil element to be coupled. Therefore, this example represents a positive coupling mechanism. However, other positive or even friction coupling variants may be provided.

In one further variant, the coupling element is a roller and the transmission element is a belt that may be wound onto the roller of the coil element to be coupled. The roller may, for example, have a round or oval (e.g., elliptic) shape. The coupling element is pretensioned (e.g., by a spring so that the belt arranged thereon is held under tension (the pretensioning causes the belt to be rolled onto the roller)).

A suitable choice of the shape of the coupling element (e.g., a diameter in the case of a circular shape) provides that it is possible for a ratio between a change to the state of expansion of the carrier structure and the change of the angle of rotation of a coil to be set. Usually, the smaller the diameter of the coupling element, the greater the change to the angle of rotation of a coil in the case of a change to the state of expansion of the carrier structure.

In one embodiment, the at least one carrier structure includes at least one additional intermediate bar arranged between two carrier elements arranged one on top of the other. At the same time, the at least one transmission element is arranged on the at least one intermediate bar. This variant facilitates a stable mechanical design of the coupling mechanism.

For example, the at least one intermediate bar is arranged between a carrier bar of a first carrier element and a carrier bar of a second carrier element. The carrier bars are arranged parallel to one another, and the first and the second carrier elements are arranged adjacent to one another. The first and the second carrier elements may include in each case a further carrier bar. The at least one intermediate bar may be arranged parallel to these further carrier bars.

In the case of a coupling bar as a transmission element, the coupling bar may be arranged rotatably about an axis of rotation of the bar on an arrangement point on the intermediate bar. In this case, the axis of rotation of the bar may lie in the carrier structure plane and is aligned perpendicular to the connecting line between the crossover points of two connected carrier elements. A belt may be permanently arranged on an arrangement point on an intermediate bar as a transmission element.

On a change to the state of expansion of the carrier structure, a distance between the arrangement point of the transmission element on the intermediate bar and the point of force introduction on the coupling element causes the coupling coil element to rotate.

A further embodiment of the magnetic resonance coil apparatus provides that each of the carrier elements forming a closed chain includes at least four carrier bars. The plurality of carrier bars enables flexible adaptation of the carrier structure to a geometry of an object under examination.

A single carrier element may include a carrier bar that is jointly included with an adjacent carrier element (e.g., two adjacent carrier elements may share a common carrier bar).

For example, the carrier bars may be arranged in the shape of a plurality of quadrangles (e.g., rhombi) connected to one another (e.g., a first and a second carrier element have the shape of a quadrangle (a rhombus), where the first and the second carrier elements include a common carrier bar). Since a rhombus-shaped carrier element may have a neighbor on each side of the rhombus, each of the four carrier bars of the rhombus-shaped carrier element may also belong in each case to a further adjacent carrier element).

Apart from a rhomboid structure, other carrier bar arrangements may also be provided. Each of the carrier elements may include six carrier bars. A carrier element including six carrier bars may have the shape of a hexagon, where the six sides of the hexagons correspond to the six carrier bars). A carrier element with six equally long carrier bars may, for example, have the shape of an equilateral hexagon (e.g., a plurality of adjacently arranged carrier elements may form a honeycomb structure). The angles at the six corners of the hexagon may adopt different values as a function of the operating state (e.g., of the state of expansion) of the carrier structure. In a maximum expanded operating state, the hexagonal shape of a carrier element may, for example, adopt the shape of a rectangle in that two pairs of adjacent carrier bars lie on a straight line in each case.

A carrier element in the shape of a hexagon may include up to six adjacent carrier elements with a common carrier bar in each case.

In one embodiment, the at least one coil element has a shape defined by the arrangement of the carrier bars. For example, the at least one coil element extends along the carrier bars of a carrier element. For example, the coil element may be arranged parallel to the main direction of extension of the carrier bar (e.g., the coil element adopts the shape of the associated carrier element). If, for example, the carrier element is rhombus-shaped, the coil element associated with the carrier element is also rhombus-shaped. If the carrier element has a hexagonal shape, the associated coil element may also have a hexagonal shape.

Depending on the shape of the carrier element, a coil element may include a plurality of coil element sections, where each coil element section of the plurality of coil element sections is assigned to a carrier bar and, for example, extends parallel thereto. For example, in the case of a rhombus-shaped carrier structure with which a carrier element includes four carrier bars, the coil element may include four coil element sections.

Since one carrier bar may be included by a plurality of (e.g., two) carrier elements, one carrier bar may be assigned a plurality of (e.g., two) coil element sections. In the case in which one coil element is arranged on each carrier element, each carrier bar belonging to a plurality of (e.g., two) adjacent carrier elements, also includes a plurality of (e.g., two) coil element sections.

The plurality of coil element sections may be permanently connected to the assigned carrier bar in each case (e.g., embedded therein).

One embodiment provides that the magnetic resonance coil apparatus includes a plurality of joints (e.g., spherical joints) connecting at least two carrier bars rotatably to one another (e.g., the joints may facilitate a relative movement (a rotation and/or tilting) of the carrier bars connected thereto). One component of this rotation may, for example, be arranged about an axis perpendicular to the plane, which is spanned by the connected carrier bars. For example, a rotation of the carrier bars of this kind by the joints enables a compressed rhomboid structure to be transferred into an extended rhomboid structure.

Additional components of the overall rotation of the elements may also be provided so that the flexibility of the carrier structure may also be increased. Hence, it is overall possible (e.g., using spherical joints) to create an easy-to-produce mechanical mechanism facilitating high flexibility of the carrier structure.

This rotatable connection enables an adaptation of the operating state of the magnetic resonance coil apparatus. The state of expansion of the carrier structure may, for example, be changed. Hence, the geometric adaptation may be adapted to the object under examination in a flexible manner.

For example, in the case of a rhomboid structure, one joint may connect up to four carrier bars to one another since the carrier bars of up to four different carrier elements abut one another at the corners of a rhombus-shaped carrier element. Similarly, in the case of carrier elements with hexagonal shapes, up to three carrier bars may be connected to one another.

In one embodiment, the joints are arranged on the ends of the carrier bars (e.g., one carrier bar includes two joints, arranged on the two ends of the carrier bar). This facilitates an effective adaptation of the geometry of the carrier structure.

In one embodiment, the at least one coil element (e.g., at the joints) includes electrical transmission units embodied in a mechanically flexible manner.

Hence, even on the rotation of carrier bars connected to one another, the at least one coil element has a continuous electrical connection (e.g., an electrical connection of coil element sections is provided over two carrier bars).

A transmission unit of this kind may, for example, include one or more sliding contacts and/or one or more hinges and/or one or more eyes and/or one or more screws and/or one or more soldered litz wires and/or one or more flex-rigid printed-circuit boards in order to achieve a mechanically flexible transmission.

In a further embodiment, the magnetic resonance coil apparatus includes a locking mechanism that is embodied to lock the at least one carrier structure at a desired state of expansion. This enables the patient comfort to be improved.

In one embodiment, the magnetic resonance coil apparatus is embodied by the adaptation of the geometric shape of the at least one carrier structure to effect adaptive decoupling of the at least one coil element.

Due to the described coupling of the state of expansion of the carrier structure, and hence also the diameter of the coil array, to the angle of rotation of a coil (e.g., the tilting of coil elements), electrical decoupling mechanisms, such as, for example, a capacitance of a capacitor used for decoupling, may be adapted to the diameter of the coil array.

The optimum tuning value with respect to the capacitance for the two extreme positions $C_{opt,max}$ for a maximum state of expansion (e.g., diameter) and $C_{opt,min}$ for a minimum state of expansion (e.g., diameter) may be determined in a calibration measurement and/or a characteristic measured for the optimum capacitance value $C_{opt}$ as function of the instantaneous radius r of the coil array $C_{opt}(r)$. These results may be used as the basis for connecting a suitable adjustable capacitor mechanically to the coil array such that in each case the optimum value is set for each radius.

Also provided is an applicator for arranging a magnetic resonance coil apparatus on an object under examination, where the applicator is embodied to accommodate the magnetic resonance coil apparatus and position the magnetic resonance coil apparatus over at least a part of the object under examination.

Assuming that the embodiment of the magnetic resonance coil apparatus supports a contraction of the at least one carrier structure to a minimum chain length, the use of a suitable supporting structure (e.g., an applicator) that expands the at least one carrier structure to a greater (e.g., maximum) chain length facilitates the application of the magnetic resonance coil apparatus to the object under examination.

The applicator may be embodied such that the applicator may be set to different expansions (e.g., different diameters).

Also provided is a method for arranging a magnetic resonance coil apparatus on an object under examination, where the magnetic resonance coil apparatus is accommodated by an applicator and positioned over at least a part of the object under examination (e.g., limbs). In other words, the magnetic resonance coil apparatus is initially pulled onto the applicator and then pushed over a leg, for example, of a patient. The applicator is then pulled off, and at least one carrier structure of magnetic resonance coil apparatus optionally contracts to a desired chain length.

If the magnetic resonance coil apparatus includes a locking mechanism, the method may include an additional act wherein the at least one carrier structure is locked at a state of expansion. A subjective sensation of pressure by the patient and/or a previous measurement of the limbs to be examined may, for example, be used as the basis for the optimum expansion of the magnetic resonance coil apparatus, which may then be retained after a possible examination.

BRIEF DESCRIPTION OF THE DRAWINGS

Corresponding parts are assigned the same reference characters in all the figures.

FIG. 5 shows exemplary coupled sections of a plurality of carrier structures in a second state of expansion;

FIG. 6 shows exemplary coupled sections of a plurality of carrier structures in a further state of expansion;

FIG. 15 shows a two-dimensional section of one embodiment of a carrier structure with hexagonal carrier elements in a first state of expansion;

FIG. 16 shows a two-dimensional section of one embodiment of a carrier structure with hexagonal carrier elements in a second state of expansion;

DETAILED DESCRIPTION

Figure 21:
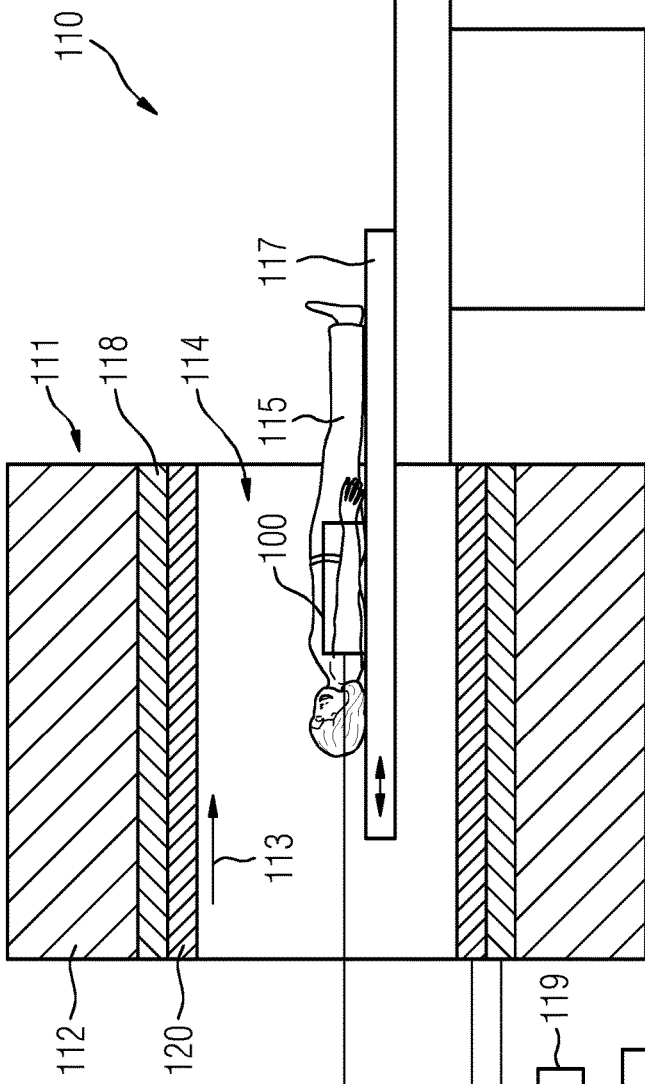
FIG. 21 is a schematic representation of one embodiment of a magnetic resonance apparatus with a magnetic resonance coil apparatus.

FIG. 21 shows an exemplary schematic representation of a magnetic resonance apparatus 110 with a magnetic resonance coil apparatus 100, which is controlled by a radio-frequency antenna control unit 121 of the magnetic resonance apparatus 110. The magnetic resonance apparatus 110 includes a magnet unit 111 including a superconducting main magnet 112 for generation of a strong and, for example, temporally constant main magnetic field 113. The magnetic resonance apparatus 110 also includes a patient receiving region 114 to receive an object under examination 115. In the present exemplary embodiment, the patient receiving region 114 has a cylindrical shape and is surrounded in a circumferential direction of the magnet unit 111. However, a different embodiment of the patient receiving region 114 may be provided at any time. The patient 115 may be moved into the patient receiving region 114 by a patient-support apparatus 116 of the magnetic resonance apparatus 110. The patient-support apparatus 116 includes a movable patient bed 117 inside the patient receiving region 114.

The magnet unit 111 further includes a gradient coil unit 118 to generate magnetic field gradients, which are used for spatial encoding during imaging. The gradient coil unit 118 is controlled by a gradient control unit 119 of the magnetic resonance apparatus 110 and includes a plurality of gradient coils that are not shown in any further detail here. The magnet unit 111 further includes a radio-frequency antenna unit 120 that, in the present exemplary embodiment, is embodied as a body coil permanently integrated in the magnetic resonance apparatus 110. The radio-frequency antenna unit 120 is configured to excite atomic nuclei that are aligned in the main magnetic field 113 generated by the main magnet 112. The radio-frequency antenna unit 120 is controlled by the radio-frequency antenna control unit 121 of the magnetic resonance apparatus 110 and emits RF pulses into an examination chamber, which is substantially formed by a patient receiving region 114 of the magnetic resonance apparatus 110. The radio-frequency antenna unit 120 is further embodied to acquire magnetic resonance signals.

To control the main magnet 112, the gradient control unit 119, and to control the radio-frequency antenna control unit 121, the magnetic resonance apparatus 110 includes the system control unit 122, which includes one or more processors. The system control unit 122 controls the magnetic resonance apparatus 110 centrally, such as, for example, the performance of a predetermined imaging pulse sequence. The system control unit 122 also includes a storage unit (not shown in detail) and an evaluation unit for the evaluation of medical image data (e.g., for the generation of time-resolved images using the magnetic resonance signals acquired). The magnetic resonance apparatus 110 further includes a user interface 123 that is connected to the system control unit 122. Control information such as, for example, imaging parameters and reconstructed magnetic resonance images may be displayed for a medical operator on a display unit 124 (e.g., on at least one monitor) of the user interface 123. The user interface 123 further includes an input unit 125 by which information and/or parameters may be input by the medical operator during a measuring process.

The magnetic resonance apparatus 110 depicted in the present exemplary embodiment may include further components conventionally included within magnetic resonance apparatuses. The general mode of operation of a magnetic resonance apparatus 110 is also known to the person skilled in the art so that no detailed description of the general components will be given.

In one embodiment, the magnetic resonance coil apparatus 100 according to one or more of the present embodiments includes at least one coil element and at least one carrier structure. The at least one carrier structure is embodied to adapt a geometric shape. FIG. 1 to FIG. 4 each depicts a section of a carrier structure 5 with a plurality of coil elements 80a, 80b, 80c, 80d by way of example. The carrier structure 5 includes a plurality of carrier elements, where FIGS. 1 to 4 only depict four of the plurality of carrier elements. The plurality of carrier elements form a closed chain (e.g., the carrier structure 5 includes N carrier elements; a first carrier element is connected to a second carrier element, the second carrier element to a third carrier element etc. and finally the N-th carrier element again to the first carrier element).

Figure 9:
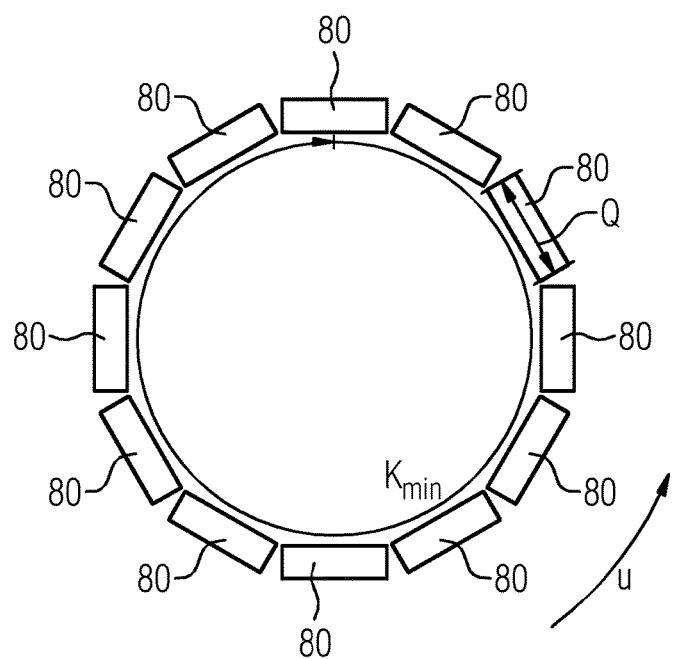
FIG. 9 is a top view of exemplary coil elements in a closed chain of a carrier structure in a first state of expansion.
Figure 10:
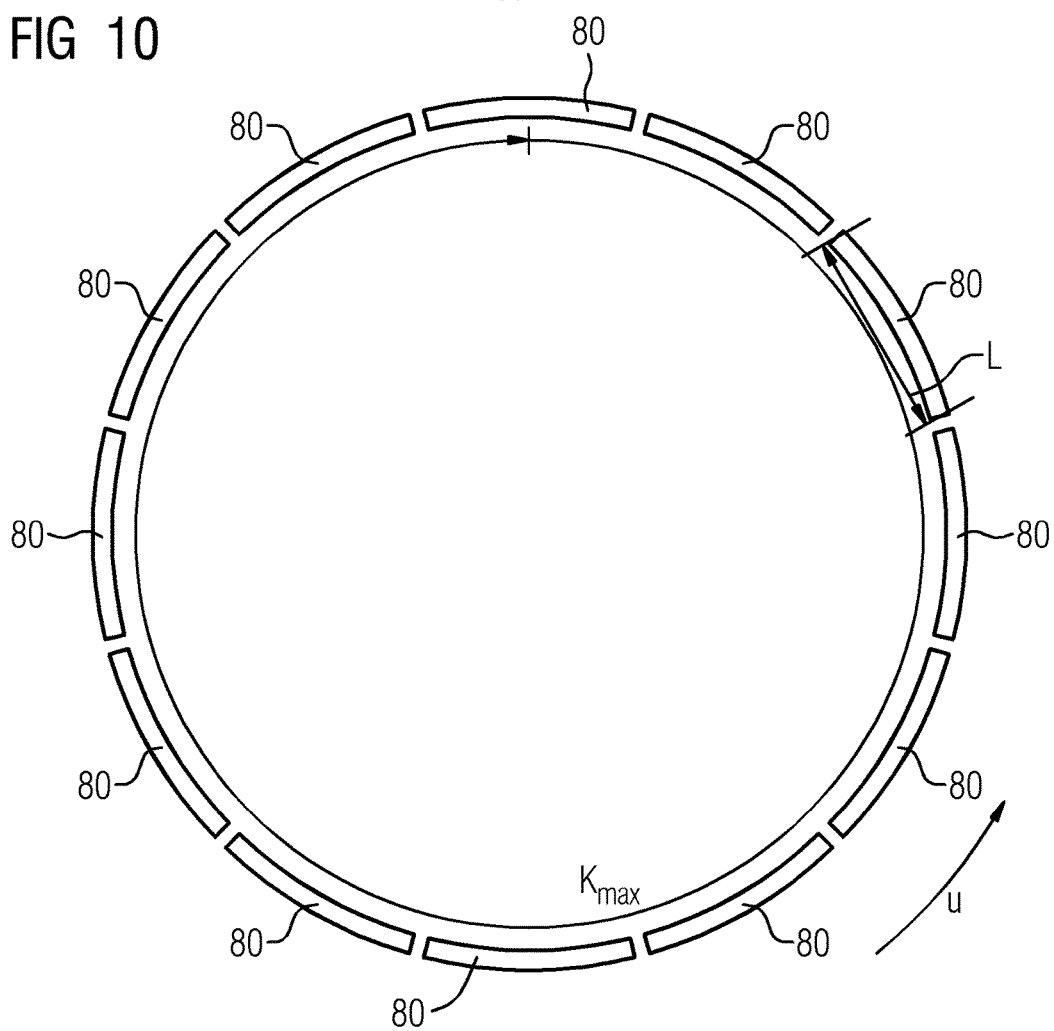
FIG. 10 is a top view of exemplary coil elements in a closed chain of a carrier structure in a second state of expansion.
Figure 11:
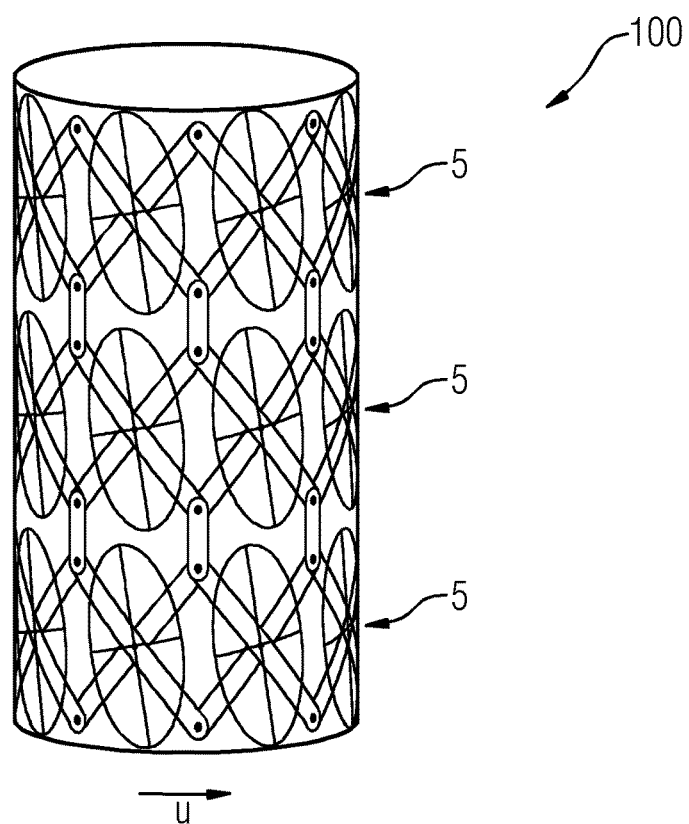
FIG. 11 is a three-dimensional schematic sketch of one embodiment of a magnetic resonance coil apparatus in a first state of expansion.
Figure 12:
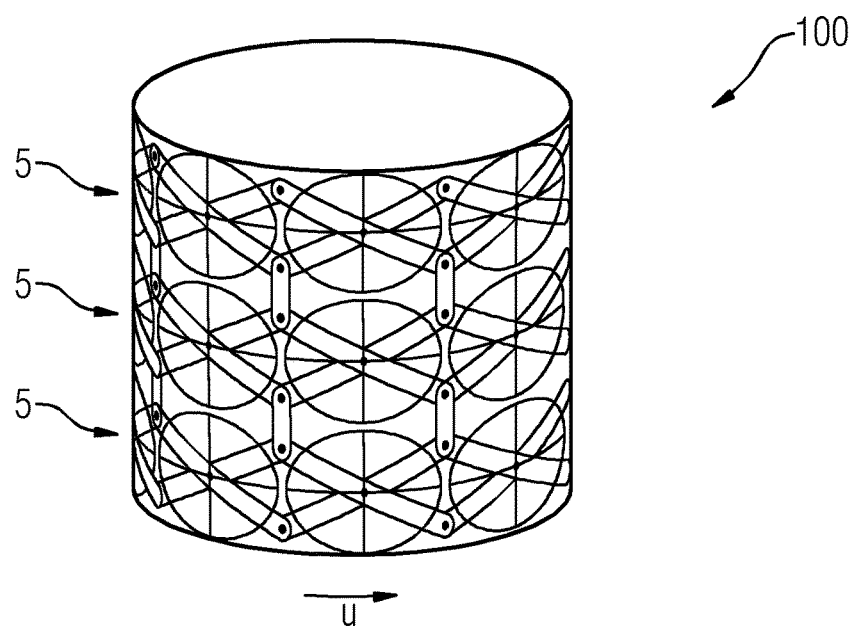
FIG. 12 is a three-dimensional schematic sketch of one embodiment of a magnetic resonance coil apparatus in a second state of expansion.

For purposes of illustration, the carrier structures 5 depicted in FIG. 1 to FIG. 6 in each case only show an unwound section of a closed chain in a circumferential direction U, where in FIG. 5 and FIG. 6 in each case three carrier structures 5 are arranged one on top of the other. FIG. 9 and FIG. 10 each depict a top view of coil elements arranged on a carrier structure with corresponding carrier elements forming a closed chain form such that the coil elements are also arranged in a ring shape. FIG. 11 and FIG. 12 are three-dimensional representations of the magnetic resonance coil devices 100 shown in FIGS. 5 and 6 in different expansion states, where once the closed chains are illustrated.

Each of the carrier elements in FIGS. 1 to 4 includes a first carrier bar 10a, 10b, 10c, 10d and a second carrier bar 20a, 20b, 20c, 20d arranged in a cross shape and rotatably and/or tiltably with respect to one another. At the same time, the carrier bars 10a, 10b, 10c, 10d, 20a, 20b, 20c, 20d of each carrier element of the same carrier structure 5 arranged in a cross shape in each case define a crossover point 15a, 15b, 15c, 15d lying on a carrier structure plane 99 of the respective carrier structure 5. Each of the carrier elements is arranged on two other carrier elements of the same carrier structure. For example, the second carrier element, which includes the first carrier bar 10b and the second carrier bar 20b, lies on the first carrier element, which includes the first carrier bar 10a and the second carrier bar 20a, and on the third carrier element, which includes the first carrier bar 10c and the second carrier bar 20c.

The first carrier bar 10a, 10b, 10c, 10d and the second carrier bar 20a, 20b, 20c, 20d of each carrier element in each case span a carrier element surface. In the unwound state depicted for purposes of illustration, as shown in FIG. 1 to FIG. 6, this carrier element surface lies parallel to the two-dimensional plane of representation. At the same time, the first and the second carrier bar are arranged rotatably with respect to each other in the carrier element surface such that the angle $\alpha$ enclosed by the carrier bars 10a, 10b, 10c, 10d, 20a, 20b, 20c, 20d in the carrier element surface, may be varied.

In one embodiment, at least one coil element is arranged on at least one of the carrier elements. In the case depicted here, in each case, one of the coil elements 80a, 80b, 80c, 80d is arranged on each carrier element. For example, the coil element 80a is arranged on the carrier element, which includes the first carrier bar 10a and the second carrier bar 20a, the coil element 80b is arranged on the carrier element, which includes the first carrier bar 10b and the second carrier bar 20b, etc.

The coil element 80a is embodied along a coil element surface in a planar manner. The coil element surface is arranged substantially parallel to the respective carrier element surface. In the unwound state as shown for purposes of illustration in FIGS. 1 to 6, both the carrier element surfaces and the coil element surfaces lie parallel to the two-dimensional plane of representation so that the carrier element surfaces and the coil element surfaces are consequently also arranged parallel to one another.

The carrier structure 5 in each case further includes a first articulated joint 25a, 25b, 25c, 25d and a second articulated joint 26a, 26b, 26c, 26d for arranging at least two carrier elements. For example, the articulated joint 25a connects the first carrier bar 10a of the first carrier element to the second carrier bar 20b of the second carrier element, and the articulated joint 26a connects the second carrier bar 20a of the first carrier element to the first carrier bar 10b of the second carrier element. The carrier bars may be moved about axes of rotation oriented perpendicularly through the articulated joints 25a, 25b, 25c, 25d, 26a, 26b, 26c, 26d from the two-dimensional plane of representation.

In one embodiment, the carrier bars of a carrier element on the crossover points 15a, 15b, 15c, 15d in each case may be connected by a further joint facilitating the rotation of the carrier bars about the crossover points 15a, 15b, 15c, 15d.

FIGS. 5 and 6 in each case depict three carrier structures 5 that are arranged at an offset (e.g., parallel) to one another. Hence, coil elements may be arranged in a plurality of rows so as to enable coverage of a larger region of the object under examination 115 than is the case with only one carrier structure 5. Depending upon the number of carrier structures used, this results in a longer or shorter tube-like structure, which may be attached about an arm or a leg of a patient 15, for example, for a magnetic resonance examination.

At the same time, for arranging the carrier structures 5, the magnetic resonance coil apparatus 100 includes structural joints 31a, 32a, 33a, 34a, 31a, 32b, 33b, 34b, 31c, 32c, 33c, 34c by which the carrier structures 5 may be connected to one another.

At the same time, the structural joints 31a, 32a, 33a, 34a, 31a, 32b, 33b, 34b, 31c, 32c, 33c, 34c are included by articulated joints 26a, 27a, 28a, 29a, 26b, 27b, 28b, 29b, 26c, 27c, 28c, 29c (e.g., the structural joint 31a is included by articulated joint 26a, the structural joint 32a is included by articulated joint 27a, etc.).

The articulated joints 26a, 27a, 28a, 29a, 26b, 27b, 28b, 29b, 26c, 27c, 28c, 29c may include contractors, such as, for example, springs that cause the closed chain to contract. Advantageously, the contractors are embodied such that, even though the magnetic resonance coil apparatus 100 nestles on a possible object under examination 115, the magnetic resonance coil apparatus 100 does not exert any unpleasant or even painful pressure thereupon.

The magnetic resonance coil apparatus 100 further includes connecting elements 70a, 71a, 70b, 71b, 70c, 71c for arranging the carrier structures 5. In this example, the connecting elements 70a, 70b, 70c are used to arrange a first carrier structure on a second carrier structure, and the connecting elements 71a, 71b, 71c are used to arrange the second carrier structure arranged on a third carrier structure. The connecting elements 70a, 71a, 70b, 71b, 70c, 71c are connected to the carrier structures 5 by the structural joints 31a, 32a, 33a, 34a, 31a, 32b, 33b, 34b, 31c, 32c, 33c, 34c. Advantageously, the connecting elements 70a, 71a, 70b, 71b, 70c, 71c have a mechanical flexibility facilitating good adaptation to objects under examination with complicated geometries, such as, for example, changes in thickness, etc.

Figure 1:
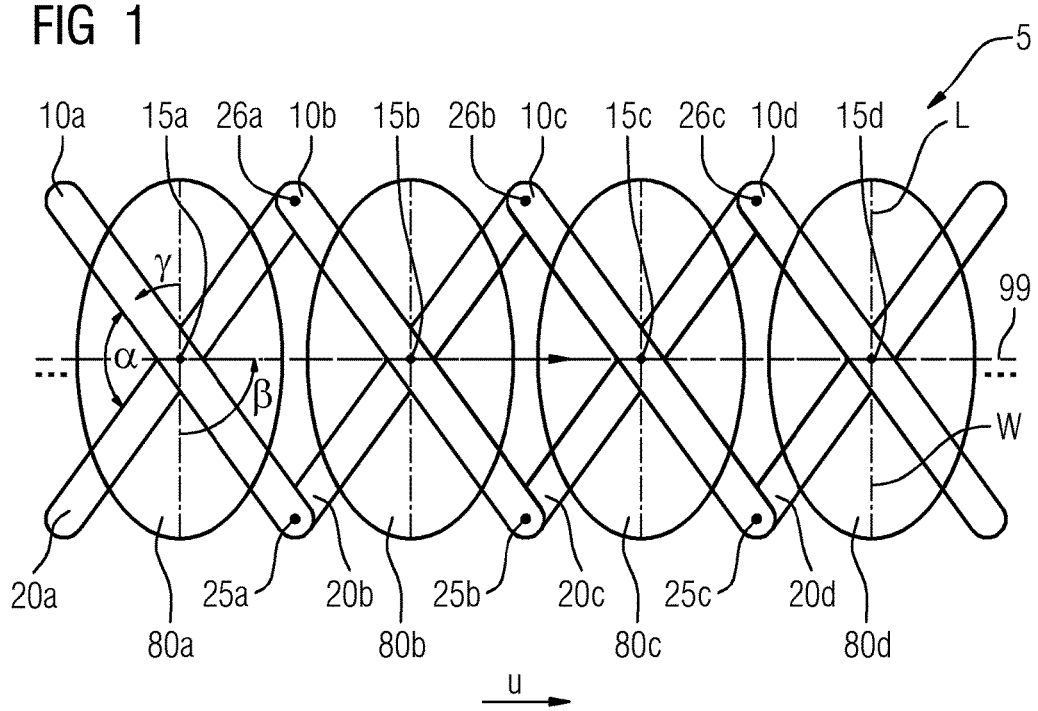
FIG. 1 shows a two-dimensional section of one embodiment of a carrier structure in a first state of expansion.
Figure 2:
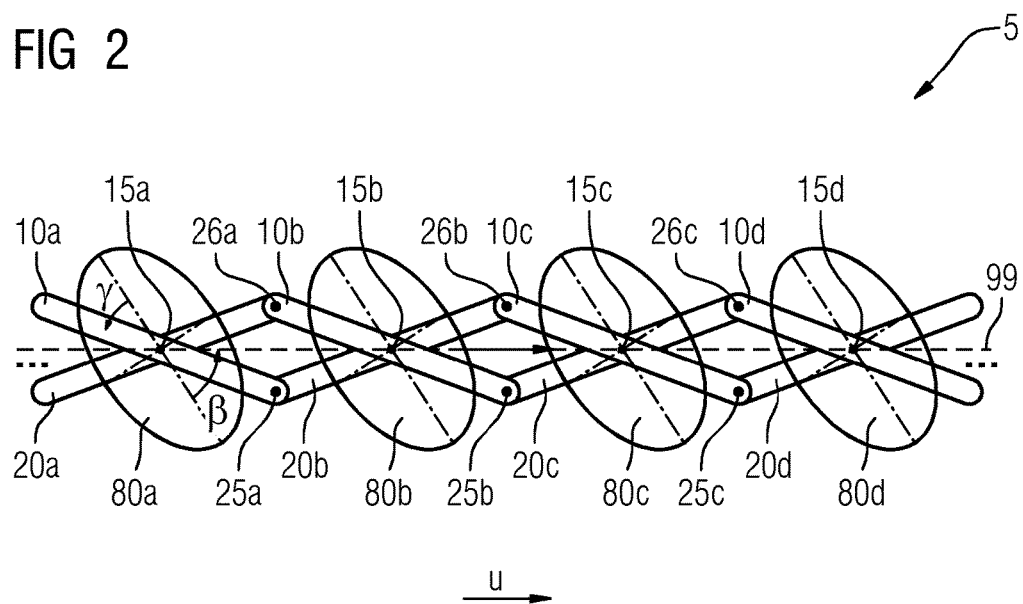
FIG. 2 shows a two-dimensional section of one embodiment of a carrier structure in a second state of expansion.

As illustrated by way of example in FIG. 1, the coil element 80a, 80b, 80c, 80d in the coil element surface have a longitudinal extension L in a longitudinal direction and a transverse extension W in a transverse direction perpendicular to the longitudinal direction. The longitudinal extension L is greater than the transverse extension W. As is evident from the further description, even with varying geometries (e.g., cross-sectional shapes) of extremities of the object under examination 115, this asymmetry is able to achieve good coverage of the object under examination by the coil elements 80a, 80b, 80c, 80d.

In the examples depicted, the coil elements in the coil element surface have an oval shape, but other shapes may also be provided.

In one embodiment, in the state of expansion of the carrier structure in which the chain length is minimal, an angle of rotation of a coil β enclosed between the longitudinal direction of the at least one coil element and the carrier structure plane 99 is greater than an angle enclosed between the transverse direction of the at least one coil element and the carrier structure plane 99. In the examples depicted in FIGS. 1 and 3, the longitudinal direction of the coil elements 80a, 80b, 80c, 80d in each case stand vertically on the carrier structure plane 99 (e.g., the angle of rotation of a coil β is 90°). It is hence greater than the angle enclosed between the transverse direction of the coil elements 80a, 80b, 80c, 80d and the carrier structure plane 99, which in this case is 0°. Hence, the greatest possible coverage of the object under examination 115 by the coil elements 80a, 80b, 80c, 80d may be achieved since almost complete coverage is provided in the circumferential direction and a relatively high degree of coverage is provided in the axial direction along the longitudinal direction of the coil elements 80a, 80b, 80c, 80d.

In the example depicted in FIG. 1, the coil elements are in each case arranged permanently on one of the carrier elements (e.g., on a carrier bar of the respective carrier element). For example, the coil element 80a is connected to the carrier bar 10a, the coil element 80b is connected to the carrier bar 10b, etc. Therefore, the relative angle γ between the longitudinal direction of the coil element and the main direction of extension of the carrier bar on which the coil element is arranged remains constant regardless of the state of expansion of the carrier structure. If, for example, the carrier structure as depicted in FIG. 1 is expanded and adopts the shape depicted in FIG. 2, this does not cause the relative angle γ to change.

A permanent arrangement between the coil element and the carrier bar is easy to implement from a technical viewpoint (e.g., by adhesion, screwing, riveting etc.). This variant also effects a certain adaptation of the coverage of the object under examination 115 by the coil elements 80a, 80b, 80c, 80d on a change to the state of expansion of the carrier structure 5 (e.g., on expansion and compression, the coil elements rotate to a certain degree so that any gaps in coverage are reduced).

Figure 3:
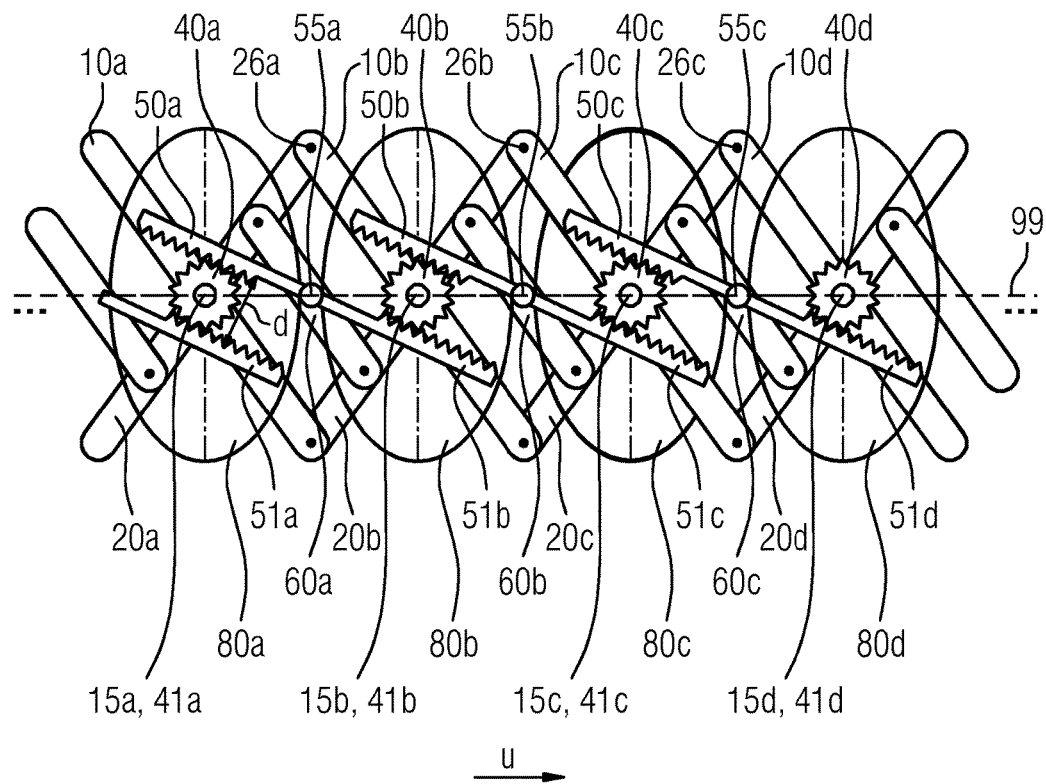
FIG. 3 shows a two-dimensional section of one embodiment of a carrier structure with a coupling mechanism in a first state of expansion.
Figure 4:
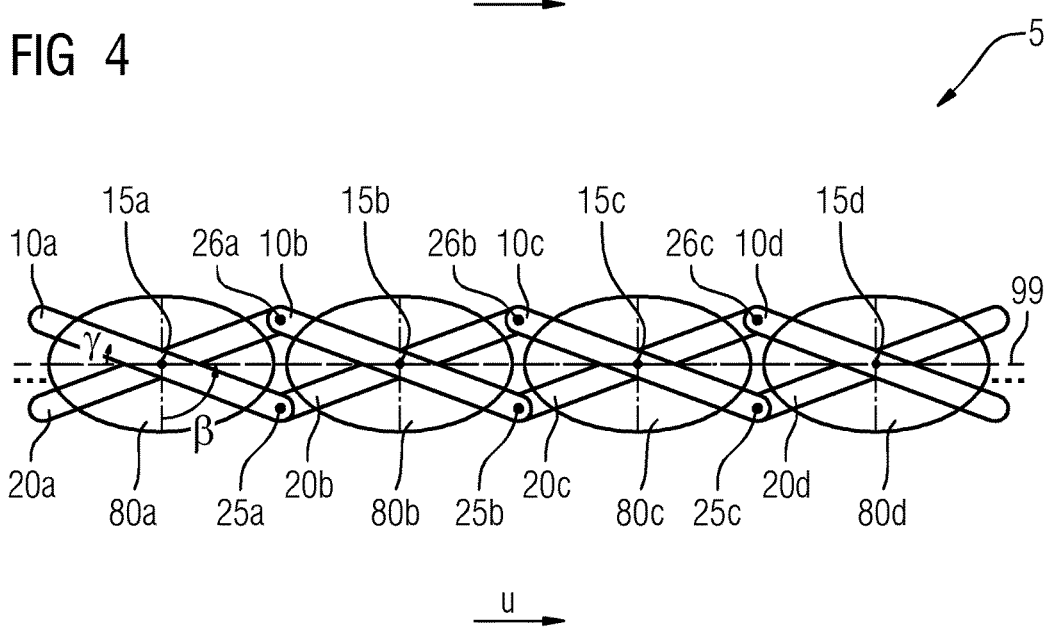
FIG. 4 shows a two-dimensional section of one embodiment of a carrier structure with a coupling mechanism in a second state of expansion.

The adaptation of the coverage may be improved if the coil elements are in each case able to rotate about an axis of rotation (hereinafter referred to as the axis of rotation of a coil) perpendicularly to the coil element surface relative to the carrier bar on which the coil elements are arranged. With respect to the exemplary embodiments, this provides that the relative angle γ changes as a function of the state of expansion of the carrier structure 5. FIG. 3 and FIG. 4 show a corresponding example. In this case, the coil elements 80a, 80b, 80c, 80d are in each case arranged movably about an axis of rotation of a coil 41a, 41b, 41c, 41d perpendicular to the coil element surface in each case on one of the carrier elements such that a change of the relative angle γ in each case enables the angle of rotation of a coil β of the coil elements to be varied. The coil axes of rotation 41a, 41b, 41c, 41d of these possible relative movements between the coil elements 80a, 80b, 80c, 80d and the carrier bars 10a, 10b, 10c, 10d extend through the crossover points 15a, 15b, 15c, 15d. To execute these possible rotations, the magnetic resonance coil apparatus 100 includes a coupling mechanism that, on a change to the state of expansion, transmits a resultant force onto the coil elements 80a, 80b, 80c, 80d. As shown in FIG. 3, to this end, the carrier structure 5 includes between two adjacent carrier elements intermediate bars 60a, 60b, 60c, which are in each case connected movably at two points to the carrier structure. One of these two points is located on a carrier bar of one of the two adjacent carrier elements, and the other of these two points is located on a carrier bar of the other of the two adjacent carrier elements. The two carrier bars are arranged parallel to one another. For example, the intermediate bar 60a is arranged on the two carrier bars 10b and 20b extending parallel to one another. The intermediate bar is arranged parallel to the further two carrier bars of the adjacent carrier elements (e.g., to the carrier bars of the adjacent carrier elements to which the intermediate bar is not connected). For example, the carrier bar 60a extends parallel to the carrier bars 10a and 20a. This arrangement of the intermediate bars provides that the intermediate bars do not block a change to the state of expansion of the carrier structure 5. In addition, the connection of the intermediate bar to the carrier bar is embodied such that the intermediate bar and carrier bar are able to rotate relative to one other in order to facilitate a change to the state of expansion of the carrier structure 5.

In each case, one or more transmission elements 50a, 51a, 50b, 51b, 50c, 51c, 51d, 50, 51 are arranged on the intermediate bars. In the example in FIG. 3, these are gear racks 50a, 51a, 50b, 51b, 50c, 51c, 51d, and in the example in FIG. 7 and FIG. 8, these are belts 50, 51. The transmission elements 50a, 51a, 50b, 51b, 50c, 51c, 51d, 50, 51 are arranged on coupling elements 40a, 40b, 40c, 40d, 40, which, for example, as is the case in FIG. 3, may be gear wheels 40a, 40b, 40c, 40d and/or, as is the case in FIG. 7 and FIG. 8, rollers 40. The arrangement of the transmission elements 50*a*, 51*a*, 50*b*, 51*b*, 50*c*, 51*c*, 51*d*, 50, 51 on the coupling elements 40*a*, 40*b*, 40*c*, 40*d*, 40 effects a coupling-in of force at one coupling-in point in each case. Due to the change to the state of expansion of the carrier structure, for each transmission element, there is also a change to the distance of each coupling-in point from the point on which the respective transmission element is arranged (e.g., connected) on the intermediate bar. This change to the distance enables forces to be transmitted from the carrier structure 5 to the coupling elements 40*a*, 40*b*, 40*c*, 40*d*, 40. The forces displace the coupling elements 40*a*, 40*b*, 40*c*, 40*d*, 40 and the coil elements 80*a*, 80*b*, 80*c*, 80*d*, 80 connected thereto in rotation about the axes of rotation of the coils 41*a*, 41*b*, 41*c*, 41*d*, 41.

Depending on the geometry of the coupling element 40*a*, 40*b*, 40*c*, 40*d*, 40, the change to the state of expansion of the carrier structure 5 causes a greater or lesser rotation of the coupling element 40*a*, 40*b*, 40*c*, 40*d*, 40. FIG. 3 depicts, by way of example, the diameter d of the coupling wheel 40*a*. The larger this diameter d, the lower the resulting rotation of the coupling element 40*a* and the coil element 80*a* for a specific change to the state of expansion of the carrier structure 5. By a suitable choice of the shape of the coupling element 40*a*, 40*b*, 40*c*, 40*d*, 40, a ratio of rotation and change to expansion may be set. This ratio is set such that, for a maximum state of expansion, the directions of longitudinal extension of the coil elements 80*a*, 80*b*, 80*c*, 80*d*, 80 lie in the carrier structure plane 99 such that optimum coverage of the object under examination by the coil elements 80*a*, 80*b*, 80*c*, 80*d*, 80 is achieved. This is shown in FIG. 4. Hence, the coverage of the object under examination 115 may be further optimized.

In the variant depicted in FIG. 3 with gear wheels 40*a*, 40*b*, 40*c*, 40*d* as coupling elements and gear racks 50*a*, 51*a*, 50*b*, 51*b*, 50*c*, 51*c*, 51*d* as transmission elements, the force transmission takes place positively by the engagement of the teeth of the elements. Embodiments with friction locking may also be provided. The coupling bars 50*a*, 50*b*, 50*c*, 51*a*, 51*b*, 51*c*, 51*d* are arranged rotatably about the axes of rotation of the bars 55*a*, 55*b*, 55*c*.

Figure 7:
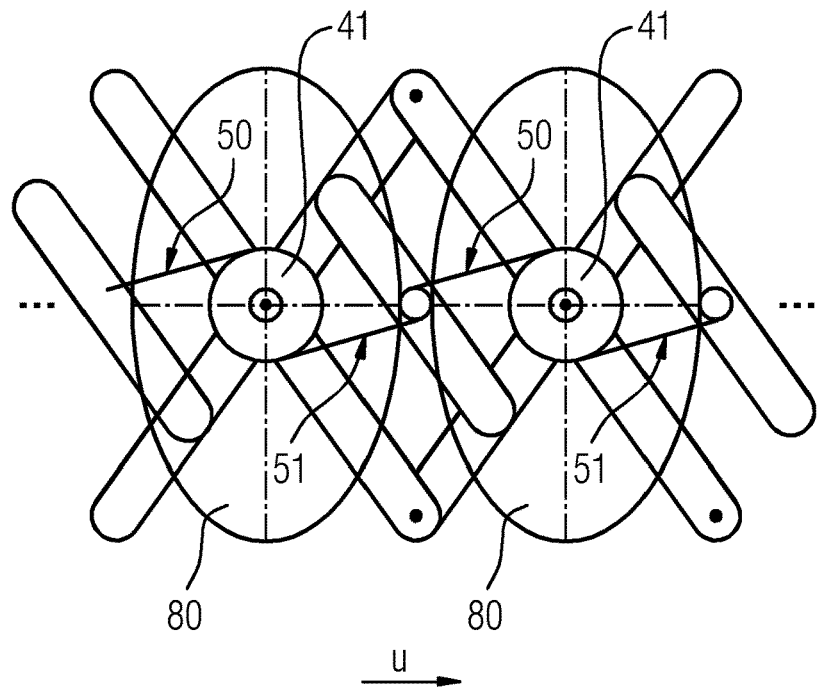
FIG. 7 shows a schematic representation of a further embodiment of a coupling mechanism.
Figure 8:
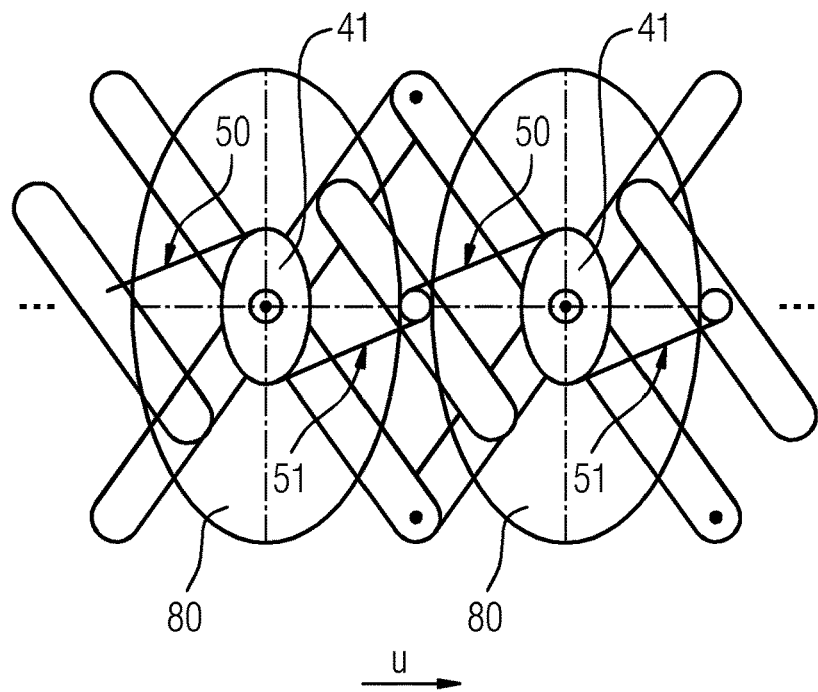
FIG. 8 shows a schematic representation of a further embodiment of a coupling mechanism.

In the variants depicted in FIG. 7 and FIG. 8, the force introduction takes place by belts wound on and secured to rollers. The rollers are pretensioned so that the rollers hold the belts under tension.

FIGS. 9 and 8 show a plurality of coil elements 80, which are in each case arranged on a closed chain of carrier elements of a carrier structure, which is not shown for purposes of clarity. While FIG. 9 shows, by way of example, a first state of expansion in which the closed chain has a minimum chain length, the chain length in FIG. 10 is maximum in a second state of expansion. A corresponding minimum state of expansion is also shown in the two-dimensional schematic sketches in FIGS. 1 and 2, whereas the maximum state of expansion corresponds to the two-dimensional schematic sketches in FIGS. 2, 4 and 5.

In one embodiment, at least one of the coil elements 80 or all of the coil elements have a curvature, as depicted in FIG. 10. The curvature of the coil elements 80 about the transverse direction causes the coil elements 80 to have a better fit to the geometry of an object under examination 115, which may be positioned within the closed chain (e.g., the filling factor is increased so that the signal-noise ratio of the measuring signal may be increased). This is, for example, advantageous if, as depicted here, the curvature is embodied about the transverse direction of coil elements 80 since particularly large distances between the coil and a possible object under examination 115 are obtained without adaptation of the curvature at the longitudinal ends. In this exemplary embodiment, the coil elements have no curvature about the longitudinal direction, as shown in FIG. 9, since even without curvature at the longitudinal ends, only small distances are achieved between the coil and a possible object under examination 115.

Figure 13:
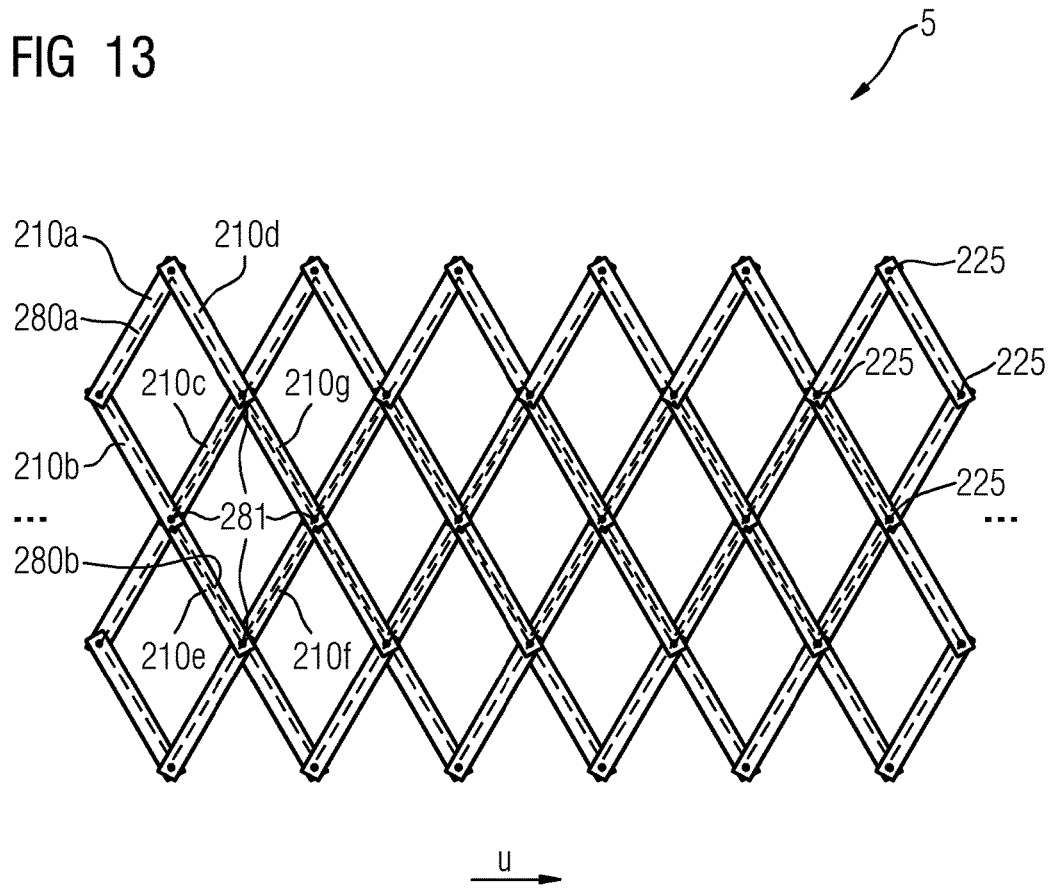
FIG. 13 shows a two-dimensional section of one embodiment of a carrier structure with rhombus-shaped carrier elements in a first state of expansion.

FIG. 13 is, in a further embodiment, a schematic sketch of a section of a carrier structure 5 that is unwound in the circumferential direction U. The carrier structure 5 includes rhombus-shaped carrier elements with four carrier bars in each case. By way of example, the carrier bars are provided with reference characters for two carrier elements: a first carrier element includes the carrier bars 210*a*, 210*b*, 210*c* and 210*d*; and a second carrier element includes the carrier bars 210*c*, 210*e*, 210*f* and 210*g*. Therefore, the first carrier element and the second carrier element share the common carrier bar 210*c*. The carrier bars 210*a* and 210*d* at the edge of the carrier structure 5 are only included by the first carrier element.

In this example, the carrier structure 5 includes three carrier element rows extending parallel to the circumferential direction U and forming a closed chain. In one embodiment, the carrier structure 5 also includes more or fewer carrier element rows.

A plurality of coil elements are arranged on the carrier structure 5. For purposes of clarity, only some of the coil elements are provided with reference characters: the coil element 280*a* is arranged on the first carrier element, and the coil element 208*b* is arranged on the second carrier element. In this example, all the other carrier elements depicted in each case include one coil element. At the same time, the coil elements 280*a*, 280*b* have a shape defined by the arrangement of the carrier bars 210*a*, 210*b*, 210*c*, 210*d*, 210*e*, 210*f*, 210*g*. For example, each coil element 280*a*, 280*b* includes four coil element sections extending parallel to the main direction of extension of the carrier bars 210*a*, 210*b*, 210*c*, 210*d*, 210*e*, 210*f*, 210*g*. Hence, each coil element 280*a*, 280*b* has a rhomboid shape overall.

Joints 225 connecting the carrier bars 210*a*, 210*b*, 210*c*, 210*d*, 210*e*, 210*f*, 210*g* rotatably to one another are arranged on the ends of the carrier bars. For purposes of representation, only some of the joints are provided with reference characters. The joints 225 enable rotations of the carrier bars to take place about axes perpendicular to the plane of representation.

Rotations about axes parallel to the plane of representation may also be provided so that the carrier element row may be moved out of the plane of representation in an undulating and/or cylindrical shape toward each other. This enables simple anatomical adaptations to be made (e.g., in order to place a magnetic resonance coil apparatus in an undulating shape over the chest and stomach of the patient 115 or in order to place a cylindrical magnetic resonance coil apparatus around an extended elbow).

The joints 225 may also include spring mechanisms, which hold the carrier structure 5 in a preferred state of expansion and/or provide that the carrier structure 5 nestles on the geometry of an object under examination 115.

In order to provide the electrical connection between the coil element sections of the coil elements 280*a*, 280*b*, at the joints, the coil elements 280*a*, 280*b* include electrical transmission units 281, which in FIG. 13 are also only depicted by way of example for the second carrier element. The transmission units 281 have a mechanical flexible embodiment so that, on a rotation (e.g., on a displacement of the relative orientation) of the carrier bars, an electrical contact between the sections of a coil element is retained. This may be achieved, for example, by sliding contacts, hinges, eyes, screws, litz wires, and/or flex-rigid printed-circuit boards.

Figure 14:
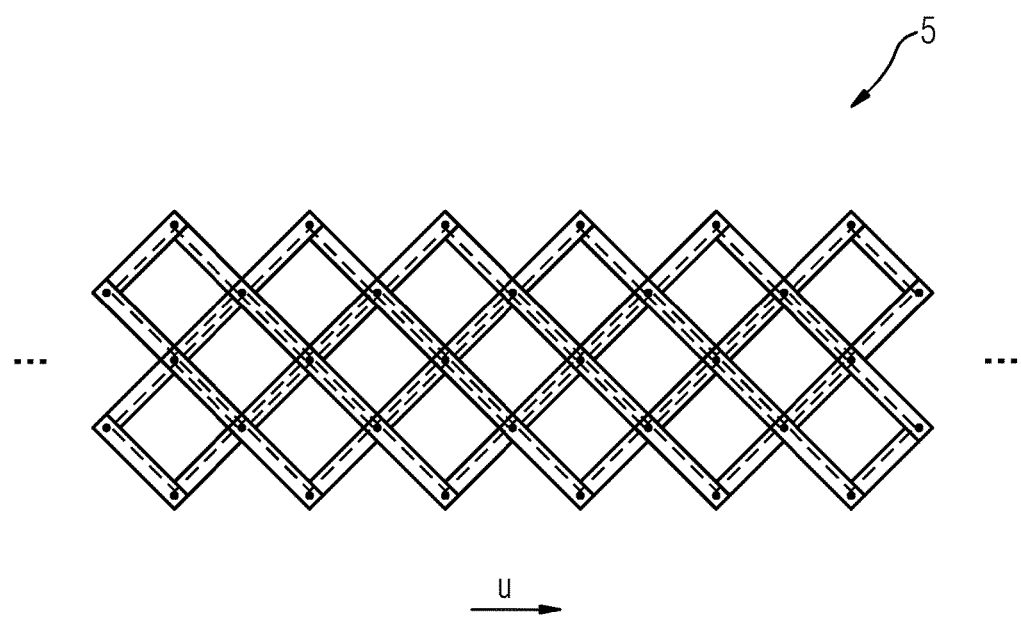
FIG. 14 shows a two-dimensional schematic section of one embodiment of a carrier structure with rhombus-shaped carrier elements in a second state of expansion.

Rotation of the carrier bars enables the carrier structure 5 to be transferred from one state of expansion, such as that depicted in FIG. 13, into another state of expansion, such as is, for example, depicted in FIG. 14. Therefore, FIG. 14 depicts the same section as shown in FIG. 13 in another state of expansion in which the expansion of the carrier structure 5 parallel to the circumferential direction is increased. This, for example, enables an object under examination with a larger circumference and/or diameter to be encompassed and/or measured with the magnetic resonance coil apparatus 100.

In the case depicted in FIGS. 13 and 14 of quadrangular carrier elements, the carrier bars arranged on a straight line, such as, for example, the carrier elements 210d and 210g, may be rigidly connected to one another and/or produced from one single part. A restriction of this kind to the possible rotational movements of the carrier bars would not impede a change to the state of expansion of the magnetic resonance coil apparatus 100.

A further variant with carrier elements, in each case including six carrier bars and having a hexagonal structure, is depicted in FIG. 15. A first exemplary carrier element includes the carrier bars 410a, 410b, 410c, 410d, 410e and 410f, and an adjacent second exemplary carrier element includes the carrier bars 410d, 410g, 410h, 410i, 410j, 410k (e.g., once again, one carrier bar 410d is included by both carrier elements). Once again, reference characters for the joints 425 are only shown by way of example for one carrier element, which connects the carrier bars rotatably with one another so that the relative orientation of the carrier bars may be adjusted.

The arrangement of the carrier bars 410a, 410b, 410c, 410d, 410e, 410f, 410g, 410h, 410i, 410j, 410k, which has changed compared to that in FIGS. 13 and 14, also results in a changed shape for the coil elements 480a, 480b, which, like the shape of the carrier elements, is hexagonal. There is no further depiction of mechanically flexible transmission units of coil elements, which are advantageously arranged in the corners of the coil elements.

In the case of a hexagonal configuration of the carrier elements, the carrier structure 5 may again adopt a plurality of states of expansion, as is evident from a comparison of FIGS. 15 and 16. For example, in the state shown in FIG. 16, the closed chains of the carrier structure may enclose a larger circumference than that in the state shown in FIG. 5. In FIG. 16, the shape of the hexagons formed by the carrier bars has changed to rectangles, but other intermediate shapes may be provided.

It is also applicable in the case of hexagons that, unlike the case in the example shown, the carrier structure 5 may also have more or less than three rows of hexagonal carrier elements.

Figure 17:
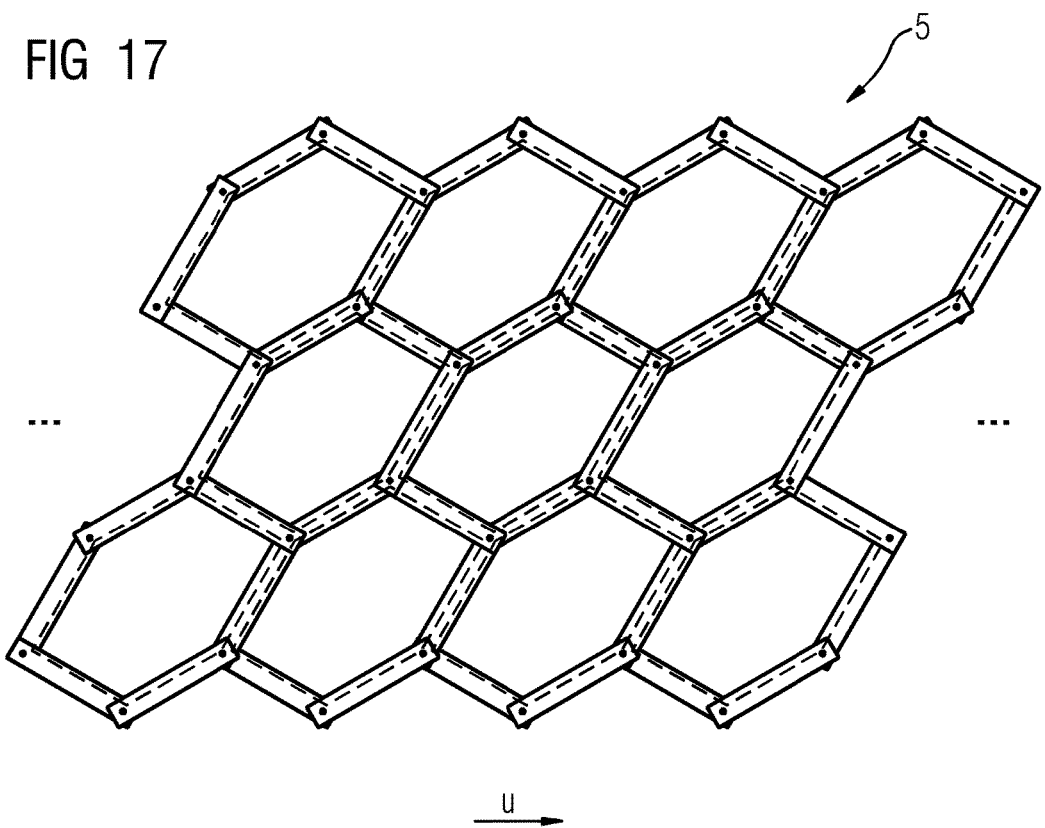
FIG. 17 shows a two-dimensional section of one embodiment of a carrier structure with hexagonal carrier elements in a third state of expansion.
Figure 18:
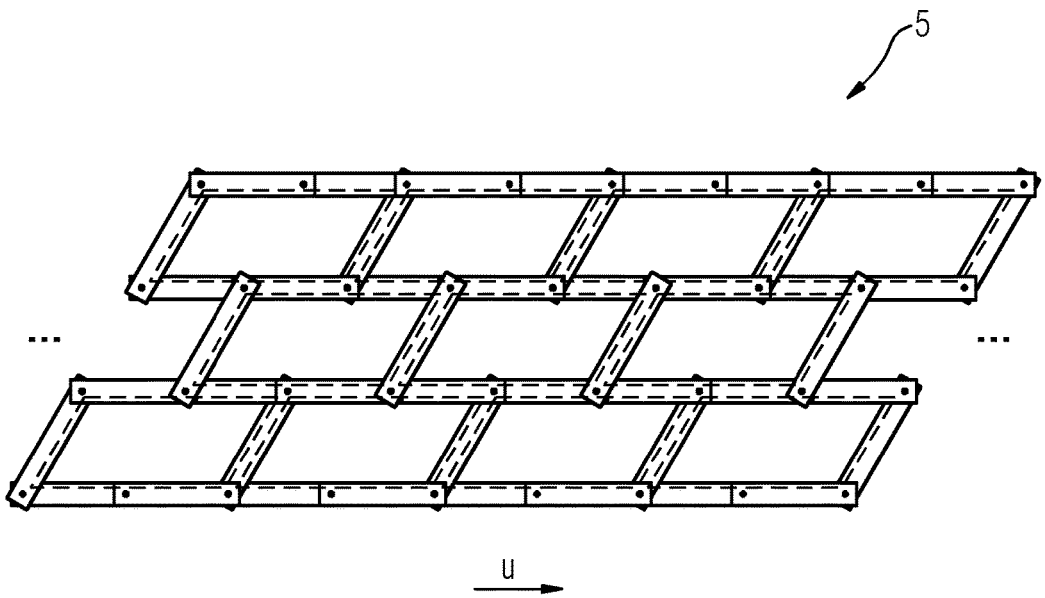
FIG. 18 shows a two-dimensional section of one embodiment of a carrier structure with hexagonal carrier elements in a fourth state of expansion.

FIGS. 17 and 18 illustrate further examples of possible expansion states. For example, the rows of carrier elements in the circumferential direction U may be pushed toward another so that this produces a further geometric possibility for the adaptation of the magnetic resonance coil apparatus 100 to the object under examination 115.

Figure 19:
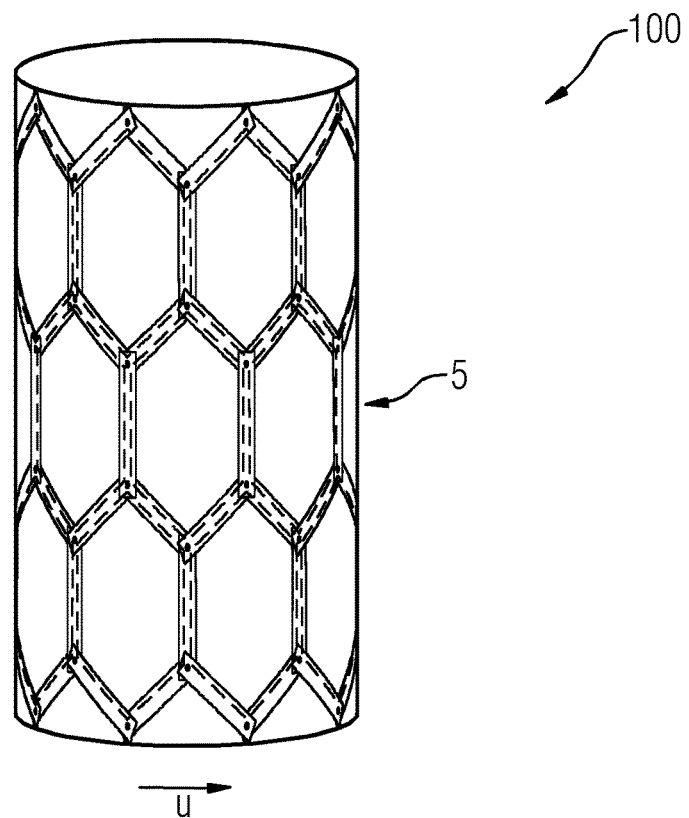
FIG. 19 is a three-dimensional schematic sketch of one embodiment of a magnetic resonance coil apparatus with hexagonal carrier elements in a first state of expansion.
Figure 20:
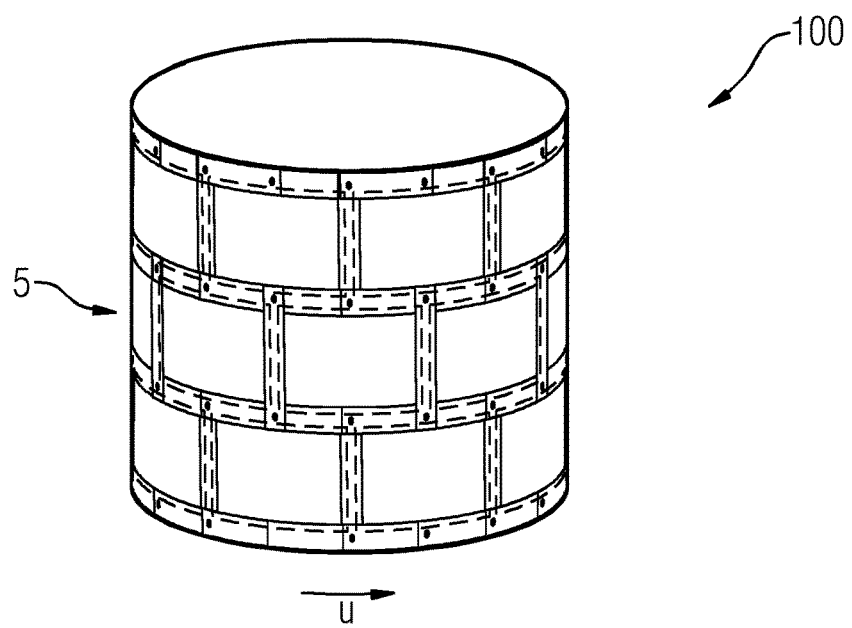
FIG. 20 is a three-dimensional schematic sketch of one embodiment of a magnetic resonance coil apparatus with hexagonal carrier elements in a second state of expansion.

FIGS. 19 and 20 show three-dimensional schematic sketches of a magnetic resonance coil apparatus 100 with hexagonal carrier elements in two different expansion states.

Figure 22:
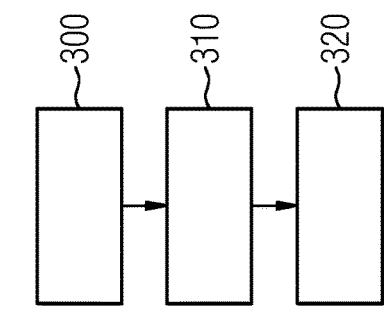
FIG. 22 is a block diagram of one embodiment of a method for arranging a magnetic resonance coil apparatus on an object under examination.

FIG. 22 illustrates a method for arranging a magnetic resonance coil apparatus 100 on an object under examination 115. In act 300, the magnetic resonance coil apparatus 100 is accommodated by the applicator. The applicator has a cavity enabling, in act 310, the applicator together with the magnetic resonance coil apparatus 100 to be moved over a body part, such as, for example, a leg, of the patient 115. In act 320, the applicator is removed again so that the magnetic resonance coil apparatus 100 remains on the body part of the patient 115 for an MRI examination.

The attached drawings, the technical content, and the detailed description relate to exemplary embodiments, but this should not be interpreted as being a restriction of the subject matter of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance coil apparatus comprising:
at least one coil element and at least one carrier structure,
wherein the at least one carrier structure is configured to adapt a geometric shape of the at least one carrier structure,
wherein each carrier structure of the at least one carrier structure comprises a plurality of carrier elements, and
wherein each carrier element of the plurality of carrier elements comprises at least two carrier bars configured to rotatably adjust relative to each other.

2. The magnetic resonance coil apparatus of claim 1, wherein the plurality of carrier elements form a closed chain.

3. The magnetic resonance coil apparatus of claim 2, wherein each carrier element of the plurality of carrier elements comprises at least four carrier bars.

4. The magnetic resonance coil apparatus of claim 3, wherein each carrier element of the plurality of carrier elements comprises six carrier bars.

5. The magnetic resonance coil apparatus of claim 3, wherein the at least one coil element has a shape defined by an arrangement of the at least four carrier bars.

6. The magnetic resonance coil apparatus of claim 3, further comprising a plurality of joints that connect the at least four carrier bars rotatably with one another.

7. The magnetic resonance coil apparatus of claim 6, wherein the plurality of joints are arranged terminally on the at least four carrier bars.

8. The magnetic resonance coil apparatus of claim 1, wherein one or more coil elements of the at least one coil element are arranged on each carrier element of the plurality of carrier elements.

9. The magnetic resonance coil apparatus of claim 1, wherein the magnetic resonance coil apparatus is configured, with reference to the adaptation of the geometric shape of the at least one carrier structure, to carry out adaptive decoupling of the at least one coil element.

* * * * *